(12) United States Patent
Honma et al.

(10) Patent No.: US 8,415,007 B2
(45) Date of Patent: *Apr. 9, 2013

(54) LAYERED PRODUCT

(75) Inventors: Masato Honma, Matsuyama (JP); Souichi Ishibashi, Paris (FR); Yoshiki Takebe, Ehime (JP); Haruo Obara, Ehime (JP); Takeshi Nishizawa, Kyoto (JP); Kosuke Shiho, Otsu (JP); Seiichiro Eto, Otsu (JP); Takashi Hasegawa, Otsu (JP); Hideaki Tanisugi, Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/323,375

(22) Filed: Dec. 12, 2011

(65) Prior Publication Data

US 2012/0094106 A1    Apr. 19, 2012

Related U.S. Application Data

(63) Continuation of application No. 10/540,624, filed as application No. PCT/JP03/16697 on Dec. 25, 2003, now Pat. No. 8,092,897.

(30) Foreign Application Priority Data

| Dec. 27, 2002 | (JP) | ................................ 2002-379832 |
| Feb. 21, 2003 | (JP) | ................................ 2003-043920 |
| Apr. 25, 2003 | (JP) | ................................ 2003-121379 |

(51) Int. Cl.
    B32B 27/12    (2006.01)

(52) U.S. Cl. ............... 428/299.1; 428/298.1; 428/301.4; 428/349; 428/355 N; 428/475.5

(58) Field of Classification Search ............... 428/297.4, 428/298.1, 299.1, 300.7, 301.4, 349, 355 N, 428/475.5
See application file for complete search history.

(56) References Cited

U.S. PATENT DOCUMENTS

| 3,472,730 A | 10/1969 | Frigstad ..................... 156/182 |
| 4,604,319 A | 8/1986 | Evans et al. ................. 442/164 |

(Continued)

FOREIGN PATENT DOCUMENTS

| EP | 1 191 079 A2 | 3/2002 |
| JP | 63-57006 A | 3/1988 |

(Continued)

OTHER PUBLICATIONS

Machine translation of Detailed Description of JP 07-047152 (Publication date of JP 07-047152 (document FD): Feb. 21, 1995).

(Continued)

*Primary Examiner* — Gerard Higgins
(74) *Attorney, Agent, or Firm* — Kubovcik & Kubovcik

(57) ABSTRACT

A layered product which is a molded object including a thermoset resin layer, a thermoplastic resin layer, and reinforcing fibers comprising many continuous filaments, wherein the thermoset resin layer has been united with the thermoplastic resin layer at the interface between these layers, the resin of the thermoset resin layer and the resin of the thermoplastic resin layer each having an irregular surface shape at the interface, and a group of filaments among the reinforcing fibers are in contact with at least the resin of the thermoset resin layer and the other group of filaments among the reinforcing fibers are in contact with at least the resin of the thermoplastic resin layer, and that side of the thermoplastic resin layer which is opposite to the interface being a surface of the molded object.

5 Claims, 11 Drawing Sheets

U.S. PATENT DOCUMENTS

| | | | | |
|---|---|---|---|---|
| 4,938,823 A | 7/1990 | Balazek et al. | ................ | 156/166 |
| 4,957,801 A | 9/1990 | Maranci et al. | ................ | 428/147 |
| 2003/0008125 A1 | 1/2003 | Delanoy et al. | ............ | 428/299.1 |

FOREIGN PATENT DOCUMENTS

| | | | |
|---|---|---|---|
| JP | 6-29684 | A | 2/1994 |
| JP | 7-40361 | A | 2/1995 |
| JP | 7-47152 | A | 2/1995 |
| JP | 7-112039 | A | 5/1995 |
| JP | 07-205171 | A | 8/1995 |
| JP | 07-214680 | A | 8/1995 |
| JP | 9-277420 | A | 10/1997 |
| JP | 9-323372 | A | 12/1997 |
| JP | 10-138354 | A | 5/1998 |
| JP | 2001-298277 | A | 10/2001 |

OTHER PUBLICATIONS

Machine translation of Claims of JP 07-047152 (Publication date of JP 07-047152 (document FD): Feb. 21, 1995).

Machine translation of Detailed Description of JP 07-112039 (Publication date of JP 07-112039 (document FE): May 2, 1995).

Machine translation of Claims of JP 07-112039 (Publication date of JP 07-112039 (document FE): May 2, 1995).

Machine translation of Detailed Description of JP 09-277420 (Publication date of JP 09-277420 (document FG): Oct. 28, 1997).

Machine translation of Claims of JP 09-277420 (Publication date of JP 09-277420 (document FG): Oct. 28, 1997).

Translation of Obara (JP 07-047152) (Publication date of JP 07-047152 (document FD): Feb. 21, 1995) submitted on Dec. 24, 2009 as a concise explanation for a previously cited document.

LAYERED PRODUCT

This application is a continuation of application Ser. No. 10/540,624, filed Jun. 24, 2005, which is a 371 of international application PCT/JP2003/016697, filed Dec. 25, 2003, which claims priority based on Japanese Patent Application Nos. 2002-379832, 2003-043920 and 2003-121379, filed Dec. 27, 2002, Feb. 21, 2003, and Apr. 25, 2003, respectively, and which are incorporated herein by reference. application Ser. No. 10/540,624 is now U.S. Pat. No. 8,092,897 B2.

TECHNICAL FIELD

The present invention relates to a layered product composed of a fiber reinforced resin reinforced by groups of reinforcing fibers consisting of numerous continuous filaments, and also to a process for producing it. The invention also relates to a layered product capable of being strongly integrated with another structural member, especially a structural member composed of a thermoplastic resin. The invention also relates to a layered product capable of being integrated with another structural member to form a molded object that can be easily decomposed and sorted into respective parts for allowing the reuse of the parts when the molded object is scrapped as waste.

The invention also relates to an electromagnetic-shielding molded object formed by integrating a layered product composed of a fiber reinforced resin reinforced by groups of reinforcing fibers consisting of numerous continuous filaments and another structural member.

The integrated molded object can be preferably used as a part member or a housing of an electric or electronic apparatus, an office automation apparatus, a household electric appliance or a medical apparatus, a rolling stock member, an aircraft member, an architectural member, etc.

BACKGROUND ART

Molded objects respectively composed of a resin reinforced by groups of reinforcing fibers consisting of numerous continuous filaments (FRPs) are widely used as various parts and members of structural bodies. Molded objects respectively using a thermosetting resin as a matrix are produced by such molding methods as press molding of is a prepreg impregnated with a thermosetting resin and resin transfer molding (RTM).

However, an FRP composed of a thermosetting resin is not suitable for producing a complicatedly shaped part or structural body by a single molding process. As a consequence, a part or structural body having a complicated shape is produced by producing plural members from the FRP and integrating those members.

The integration methods include mechanical bonding methods using bolts, rivets, screws and the like and bonding methods using adhesives. A mechanical bonding method has such problems that the reduction of production cost is very difficult since a step for machining bonding portions beforehand is necessary and that application is limited in view of appearance. A bonding method using an adhesive has such problems that the reduction of production cost is very difficult since a bonding step including the pre-arrangement of an adhesive and adhesive application work is necessary, and that no sufficiently satisfactory reliability can be obtained in the bonding strength.

A method for integrating a member formed of a thermoplastic resin and a member formed of an FRP composed of a thermosetting resin is proposed in JP10-138354A. This method comprises a first step of laminating a thermoplastic resin film on the surface of a prepreg consisting of reinforcing carbon fibers and a thermosetting resin, for forming a first layered product, a second step of applying a heat and pressure to the obtained first layered product under such conditions as setting the thermosetting resin but not causing the film to flow, to form a second layered product composed of a carbon fiber reinforced thermosetting resin having the thermoplastic resin film sticking to it, and a third step of injection-molding a thermoplastic resin onto the surface of the thermoplastic resin film of the second layered product placed in a mold, to bond the thermoplastic resin member (core member) formed by the injection molding and the second layered product (surface member) to each other. According to this method, since the core member composed of a thermoplastic resin and the surface member are joined through the thermoplastic resin film of the surface member, there is no special problem in the bonding strength at the joint.

However, there is a problem that the bonding strength at the joint between the thermosetting resin and the thermoplastic resin film in the surface member is not sufficient. The reason is that the latter joint is formed by bonding between a thermosetting resin and a thermoplastic resin, namely, bonding between different materials.

An object of the invention is to provide a layered product that reduces the conventional fear about the bonding strength in the bonding between different materials.

Fiber reinforced resins (FRPs) are widely used as materials for forming various products. On the other hand, the weight reduction of these products is being demanded. Above all, as portable electronic apparatuses typified by notebook personal computers, cellular phones and portable information terminals are increasingly popularly used, thinner and lighter-weight products are strongly demanded in the market. In this connection, it is demanded that the housings and internal members constituting the products are reduced in thickness and weight and enhanced in stiffness.

To meet this demand, magnesium alloys are used anyway. The demand for higher stiffness further grows, and the use of metallic materials with higher stiffness such as aluminum alloys is being studied. However, it is difficult to easily produce complicatedly shaped parts and products at high productivity from these metallic materials.

JP 2001-298277 A proposes a housing obtained by integrally bonding a metallic molded object and injection molded ribs using an epoxy resin-based coating material. JP06-029684A proposes an electromagnetic-shielding housing obtained by integrating a metallic sheet and a molded synthetic resin object. However, these housings cannot satisfy the demand for lighter weight, since the specific gravity of the metallic material is large, though they can satisfy the demand for smaller thickness and higher stiffness.

Considering the recycling of products, it is difficult to separate and sort the products obtained by integrating members formed of different materials into the respective members. As a result, contaminants consisting of different materials are generated to pose such problems that it is difficult to reuse those members and that the cost of recycling increases.

In view of the problems of the prior art, an object of the invention is to provide a layered product that can be easily integrated with another structural member at excellent bonding strength, and also to provide a process for producing it. The integrated molded object obtained by using the layered product is excellent not only in mechanical properties, light weight and electromagnetic shielding performance but also in design flexibility and recyclability, and can be used suitably as a housing of an electric or electronic apparatus or portable information terminal, or as a structural member of a transport apparatus such as a motor vehicle or aircraft.

DISCLOSURE OF THE INVENTION

First Embodiment of the Layered Product of the Invention

The layered product of the invention is a molded object comprising a thermosetting resin layer, a thermoplastic resin layer and groups of reinforcing fibers consisting of numerous continuous filaments, wherein the thermosetting resin layer and the thermoplastic resin layer are integrated at the interface between these layers in such a manner that the resin of the thermosetting resin layer and the resin of the thermoplastic resin layer are formed to be rugged at the interface; a set of filaments among the groups of reinforcing fibers is kept in contact with at least the resin of the thermosetting resin layer while the other set of filaments among the groups of reinforcing fibers is kept in contact with at least the resin of the thermoplastic resin layer; and the face of the thermoplastic resin layer opposite to the interface is positioned on the surface of the molded object.

In the layered product of the invention, it is preferred that the numerous continuous filaments are arranged in one direction, and that is the interface between the thermosetting resin layer and the thermoplastic resin layer exists among the groups of reinforcing fibers.

In the layered product of the invention, it is preferred that the glass transition temperature of the resin forming the thermosetting resin layer is 60° C. or higher.

In the layered product of the invention, it is preferred that in the thermoplastic resin layer, the maximum thickness of the area where the continuous filaments exist is 10 μm or more. It is preferred that the maximum thickness is 1,000 μm or less.

In the layered product of the invention, it is preferred that the surface area of the thermoplastic resin layer accounts for 0.1 to 50% of the surface area of the layered product.

In the layered product of the invention, a layer having the same structure as that formed of the thermosetting resin, the thermoplastic resin and groups of reinforcing fibers consisting of numerous continuous filaments can be formed on the face of the layered product on the side opposite to the side where the thermoplastic resin layer is positioned.

In the layered product of the invention, it is preferred that the bonding strength of the test piece of the layered product defined later based on ISO4587 is 6 MPa or higher at room temperature.

In the layered product of the invention, it is preferred that the numerous continuous filaments constituting the groups of reinforcing fibers are carbon fibers.

In the layered product of the invention, it is preferred that the thermosetting resin is a resin mainly composed of an epoxy resin.

In the layered product of the invention, it is preferred that the thermoplastic resin is at least one resin selected from a group consisting of polyamide-based resins, polyester-based resins, polycarbonate-based resins, styrene-based resins, EVA resin, urethane-based resins, acrylic resins, polyolefin-based resins and PPS-based resins.

Second Embodiment of the Layered Product of the Invention

The layered product of the invention is a layered product comprising a thermosetting resin composition having groups of reinforcing fibers consisting of numerous continuous filaments arranged in a thermosetting matrix resin and a film composed of a thermoplastic resin composition formed at least on a portion of the surface of the thermosetting resin composition, wherein the normal bonding strength defined later between the layered product and another molded object bonded through the film is 10 MPa or higher at a temperature of 40° C. and lower than 10 MPa at a temperature of 140° C.

In the layered product of the invention, it is preferred that the average thickness of the film composed of the thermoplastic resin composition is from 0.1 to 1,000 μm.

In the layered product of the invention, it is preferred that the numerous continuous filaments constituting the groups of reinforcing fibers are carbon fibers.

In the layered product of the invention, it is preferred that the thermosetting resin is a resin mainly composed of an epoxy resin.

In the layered product of the invention, it is preferred that the thermoplastic resin is at least one resin selected from a group consisting of polyamide-based resins, polyester-based resins, polycarbonate-based resins, styrene-based resins, EVA resin, urethane-based resins, acrylic resins, polyolefin-based resins and PPS-based resins.

Process for Producing a Layered Product of the Invention:

The process for producing a layered product of the invention comprises the step of disposing a base material for thermal bonding composed of a thermoplastic resin, on a surface of a prepreg obtained by impregnating groups of reinforcing fibers consisting of numerous continuous filaments with a thermosetting resin not yet set, and impregnating the groups of reinforcing fibers with the thermoplastic resin of the base material for thermal bonding, during the setting reaction of the thermosetting resin or during preheating before the setting reaction.

In the process for producing a layered product of the invention, it is preferred that a pressing pressure of 0.1 MPa or higher is caused to act when the groups of reinforcing fibers are impregnated with the thermoplastic resin.

Integrated Molded Object of the Invention:

In the integrated molded object of the invention, a first member composed of the layered product of the invention and a second member composed of another structural member are bonded to each other through the thermoplastic resin in the first member.

In the integrated molded object of the invention, it is preferred that the second member is at least one member selected from the group consisting of a member composed of a layered product of the invention, a member composed of a thermoplastic resin composition and a member composed of a metallic material.

Particular examples of the integrated molded object of the invention include parts, members and housings of electric and electronic apparatuses, office automation apparatuses, household electric appliances and medical apparatuses, and parts, members and panels for motor vehicles, two-wheelers, bicycles, aircraft and architecture.

Process for Producing an Integrated Molded Object of the Invention:

The process for producing an integrated molded article of the invention comprises the step of integrating a first member composed of the layered product of the invention and a second member composed of another structural member with each other, by at least one integration method selected from the group consisting of thermal welding, vibration welding, ultrasonic welding, laser welding, insert injection molding and outsert injection molding.

Base Material for Thermal Bonding of the Invention:

A base material for thermal bonding of the invention is a base material for thermally bonding of adhering members of the identical and/or different kinds, wherein the bonding strength (S) of the test piece of the layered product defined in the specification based on ISO4587 is 5.0 MPa or higher at a temperature of 100° C. and 1.0 MPa or lower at a temperature of 200° C.

In the base material for thermal bonding of the invention, it is preferred that where the bonding strength at a temperature t (° C.) is $S_t$ (MPa) and the bonding strength at a temperature (t+30) (° C.) is $S_{(t+30)}$ (MPa), the temperature t satisfying the relation of $S_t \geq 3 \times S_{(t+30)}$ is from 100° C. to 200° C.

In the base material for thermal bonding of the invention, it is preferred that the base material is composed of a copolyamide-based resin composition. It is preferred that the copolyamide-based resin composition contains ternary polyamide 6/66/610 as a component.

In the base material for thermal bonding of the invention, it is preferred that the base material is in a form of a nonwoven fabric or film having a unit weight of 1 to 100 g/m².

The base material for thermal bonding of the invention can be preferably used as a base material for thermal bonding in a process for producing the layered product of the invention.

Electromagnetic-Shielding Molded Object of the Invention:

The electromagnetic-shielding molded object of the invention is a molded object obtained by integrating a first structural member composed of a resin composition having groups of conductive fibers consisting of numerous continuous filaments arranged therein and a second structural member composed of a thermoplastic resin composition, in which the electromagnetic shielding property of the first structural member at a frequency of 1 GHz measured according to the KEC method is 40 dB or more.

In the electromagnetic-shielding molded object of the invention, it is preferred that the first structural member is the layered product of the invention, in which the numerous continuous filaments constituting the groups of reinforcing fibers are carbon fibers.

In the electromagnetic-shielding molded object of the invention, it is preferred that the flexural modulus the first structural member based on ASTM-D790 is 8 GPa or more as the test piece defined later.

In the electromagnetic-shielding molded object of the invention, it is preferred that the average thickness of the first structural member is 1.6 mm or less.

In the electromagnetic-shielding molded object of the invention, it is preferred that when the molded object is observed from outside, a pattern based on an arranged state of the numerous continuous filaments is observed.

In the electromagnetic-shielding molded object of the invention, it is preferred that a thermosetting resin or a thermoplastic resin is selected as the resin composition of the first structural member in response to the application of the molded object.

In the electromagnetic-shielding molded object of the invention, it is preferred that the thermoplastic resin composition of the second structural member contains discontinuous carbon fibers, that the weight average fiber length Lw of the carbon fibers is 0.4 mm or more, and that the ratio Lw/Ln of the weight average fiber length Lw to the number average fiber length Ln is from 1.3 to 2.0.

Particular examples of the electromagnetic-shielding molded object of the invention include parts, members and housings of electric and electronic apparatuses, office automation apparatuses, household electric appliances, and medical apparatuses. Furthermore, there is an electromagnetic-shielding molded object, in which the first structural member is positioned at least on a portion of the top face of any of the housings while the second structural member is positioned at a member including any one or more of a frame, boss, rib, hinge and runner of the housing.

Process for Producing an Electromagnetic-Shielding Molded Object of the Invention:

The process for producing an electromagnetic-shielding molded object of the invention comprises a first step of inserting a first structural member produced by molding beforehand, into a mold and a second step of injection-molding a thermoplastic resin composition to form a second structural member onto the first structural member inserted in the mold, for integrating the second structural member with the first structural member.

The process for producing an electromagnetic-shielding molded object of the invention comprises the step of integrating a first structural member produced by molding beforehand and a second structural member produced by injection molding beforehand, by means of ultrasonic welding.

THE BEST MODES FOR CARRYING OUT THE INVENTION

First Embodiment of the Layered Product of the Invention

Figure 1:
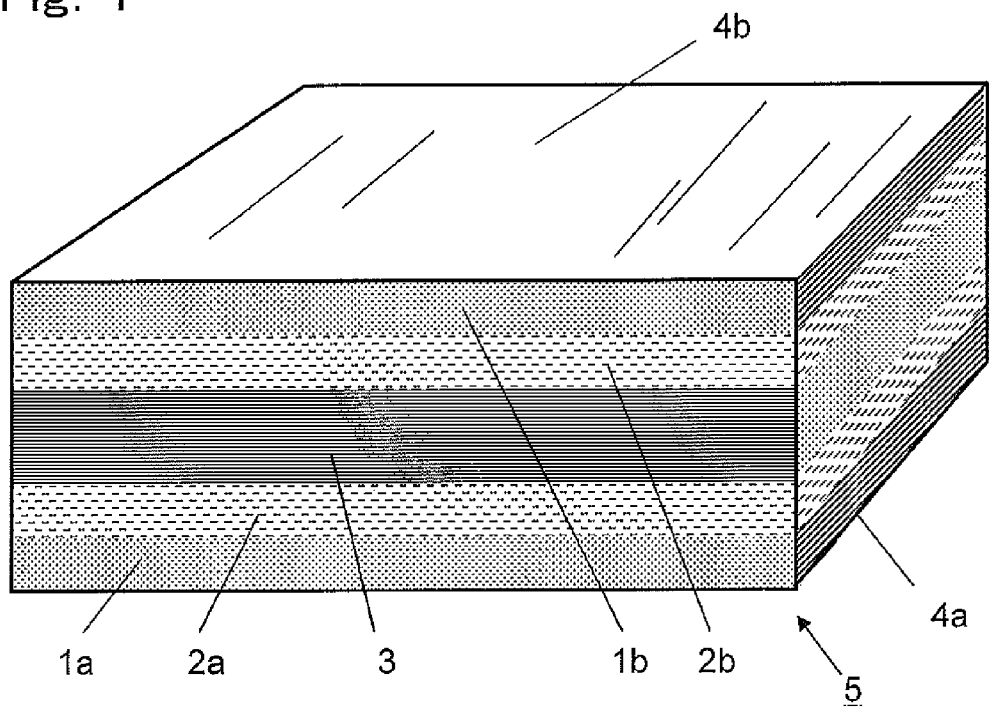
FIG. 1 is a typical perspective view showing a mode of the layered product of the invention.

FIG. 1 shows a layered product 5. The layered product 5 consists of five layers sequentially laminated from a bottom face 4a to a top face 4b. That is, the layered product 5 consists of a first layer 1a, a second layer 2a, a third layer 3, a fourth layer 2b and a fifth layer 1b.

Figure 2:
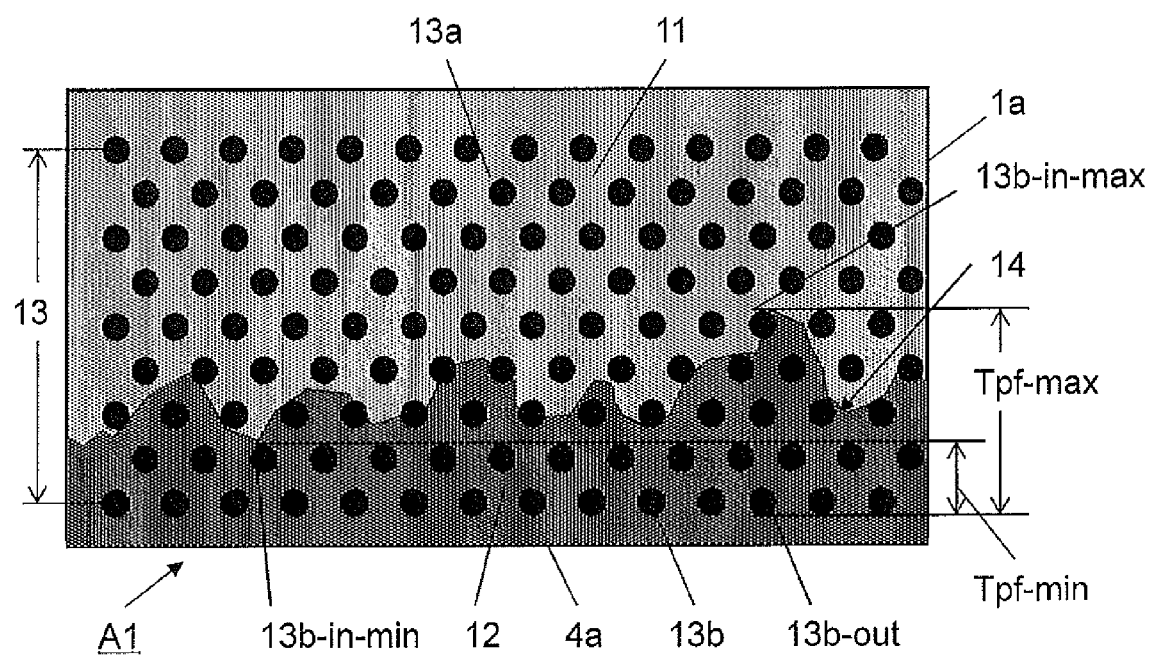
FIG. 2 is an expanded sectional view showing a part of the surface layer portion of the layered product of FIG. 1.

FIG. 2 shows an expanded sectional view showing a part of the first layer 1a. FIG. 2 was prepared based on a photograph obtained by photographing a cross section of a part of the first layer 1a using a scanning electron microscope (SEM).

The first layer 1a is an example of the layered product A1 of the invention. The layered product A1 (first layer 1a) comprises a thermosetting resin layer 11, a thermoplastic resin layer 12 and groups of reinforcing fibers 13 comprising numerous continuous filaments 13a and 13b. The thermosetting resin layer 11 and the thermoplastic resin layer 12 are integrated while forming ruggedness at the interface 14 between these layers 11 and 12. A set of filaments 13a among the groups of reinforcing fibers 13 is kept in contact with at least the resin of the thermosetting resin layer 11, and the other set of filaments 13b among the groups of reinforcing fibers 13 is kept in contact with at least the resin of the thermoplastic resin layer 12. The face of the thermoplastic resin layer 12 on the side opposite to the interface 14 is positioned at the surface of the layered product A1 (first layer 1a).

The layered product A1 (first layer 1a) is produced by disposing a base material for thermal bonding composed of a thermoplastic resin on the surface of a prepreg obtained by impregnating the groups of reinforcing fibers 13 comprising numerous filaments 13a and 13b with a thermosetting resin not yet set, and impregnating the thermoplastic resin of the base material for thermal bonding into the groups of reinforcing fibers 13 during the setting reaction of the thermosetting resin or during preheating before the setting reaction.

In the produced layered product A1 (first layer 1a), the thermosetting resin forms the thermosetting resin layer 11 and the thermoplastic resin forms the thermoplastic resin layer 12. The impregnation of the groups of reinforcing fibers 13 with the thermoplastic resin, namely, the permeation of the thermoplastic resin among the numerous filaments 13a and 13b constituting the groups of reinforcing fibers 13 forms the rugged interface 14 between the thermosetting resin layer 11 and the thermoplastic resin layer 12.

As the prepreg, as required, a prepreg in which plural groups of reinforcing fibers 13 are arranged in the width direction of the prepreg or layered in the thickness direction of the prepreg can be used. FIG. 2 shows the groups of reinforcing fibers 13 positioned in the outermost layer in the prepreg.

The groups of reinforcing fibers 13 of the layered product A1 consist of numerous filaments continuous with a length of 10 mm or more in at least one direction. It is not necessary that the groups of reinforcing fibers 13 extend continuously over the entire length of the layered product A1 in the longitudinal direction or over the entire width of the layered product A1 in the transverse direction, and they can also be broken halfway.

The groups of reinforcing fibers 13 can be provided in such a style as filament bundles (fiber bundles) respectively consisting of numerous filaments, a cloth formed of the fiber bundles, filament bundles respectively having numerous filaments arranged in one direction (unidirectional fiber bundles), or a unidirectional cloth formed of the unidirectional fiber bundles. In view of the productivity of the prepreg or layered product, a cloth or unidirectional fiber bundles are preferred. The groups of reinforcing fibers of the layered product A1 can consist of plural fiber bundles of the same style or plural fiber bundles of different styles. As required, a sandwich style having another base material laminated between layers of groups of reinforcing fibers can also be used.

The layered product 5 of FIG. 1 is a five-layer product as described before. The first layer 1a and the fifth layer 1b are structurally identical. The surface 4b of the fifth layer 1b corresponds to the surface 4a of the first layer 1a. The second layer 2a and the fourth layer 2b are structurally identical. These layers 2a and 2b respectively consist of a matrix resin (for example, epoxy-based resin) and groups of reinforcing fibers (for example, groups of carbon fibers). The third layer 3 also consists of a matrix resin (for example, epoxy-based resin) and groups of reinforcing fibers (for example, groups of carbon fibers). In the layered product A1 of FIG. 1, for control of entire mechanical properties, the groups of reinforcing fibers in the respective layers 1a, 2a, 3, 2b and 1b are different in the direction of arrangement. Especially for efficiently enhancing, the elastic modulus and strength of the layered product A1, it is preferred to use unidirectional fiber bundles as the groups of reinforcing fibers. In the case where the layered product A1 is thin and limited in the number of layers, it is preferred that the groups of reinforcing fibers of the outermost layers 1a and 1b are arranged in a direction of about 45 degrees when the longitudinal direction of the layered product A1 is 0 degree.

To make the molded object formed of the layered product A1 look like a cloth, it is preferred that a cloth of plain weave, satin weave, twill weave or the like is used as the groups of reinforcing fibers of the outermost layers of the layered product A1.

The number of filaments constituting one group of reinforcing fibers is usually from 300 to 48,000. It is preferred that the number of filaments is from 300 to 12,000, and a more preferred range is from 1,000 to 6,000. The number of filaments in this range is preferred also in view of beautiful cloth appearance.

A conventional layered product in which a thermoplastic resin layer adheres to the surface of a thermosetting resin layer reinforced by groups of reinforcing fibers is known. This conventional layered product is bonded to another adhering member through the thermoplastic resin adhering on the surface. By this bonding, a desired molded object is produced.

The conventional layered product is produced by letting a thermoplastic resin layer adhere, using an adhesive, to the surface of a thermosetting resin layer having its thermosetting resin hardened and reinforced by groups of reinforcing fibers. As another method, the conventional layered product is produced by forming a thermoplastic resin layer on the surface of a thermosetting resin layer not yet set but containing groups of reinforcing fibers, and melting the thermoplastic resin layer when the thermosetting resin is set, for letting the thermoplastic resin layer adhere to the surface of the thermosetting resin layer in such a condition that the molten thermoplastic resin does not disturb the arrangement of the groups of reinforcing fibers, that is, in such a condition that the molten thermoplastic resin does not go into the groups of reinforcing fibers. The conventional layered product is used to produce a molded object in which the layered product is bonded to another adhering member through the thermoplastic resin layer on the surface. However, some molded objects are acted on by external forces. In this case, it can happen that rupture occurs at the joint between the thermoplastic resin layer and the adhering member, but as a problem, it can happen that rupture occurs at the joint between the thermosetting resin layer and the thermoplastic resin layer.

This problem can be solved by the layered product A1 of the invention. The layered product A1 has a feature that it is a molded object in which the resin of a thermosetting resin layer and the resin of a thermoplastic resin layer are integrated while forming ruggedness so at their interface, and in which a set of filaments among groups of reinforcing fibers is kept in contact with at least the resin of the thermosetting resin layer while the other set of filaments among the groups of reinforcing fibers is kept in contact with at least the resin of the thermoplastic resin layer. This feature also includes a case where some filaments among the groups of reinforcing fibers are kept in contact with the resin of the thermosetting resin partially in their longitudinal direction and also are kept in contact with the resin of the thermoplastic resin layer in the other portions of them. This feature cannot be seen in the conventional layered product.

Three testing methods for verifying the structure of the layered product A1 of the invention and the structure of the conventional layered product are explained below in reference to FIGS. 3 to 7.

The first testing method is based on the observation of a cross section of the surface layer portion of a layered product by a scanning electron microscope (SEM) or transmission electron microscope (TEM). The observation of a cross section can be made, as required, based on a photograph showing the cross section. The test piece is a thin section prepared using a surface layer portion cut out from a layered product. When the test piece is prepared, it can happen that some filaments among the groups of reinforcing fibers fall off, but this does not pose any problem if the falling is to such an extent that does not affect the observation. The test piece can also be stained as required for adjusting the contrast for observation.

The filaments constituting the groups of reinforcing fibers are usually observed to be circular in cross section. In the case where a filament falls off, it is usually observed as a circular vacancy mark. In the portion other than the portion where the filaments constituting the groups of reinforcing fibers are positioned, the thermosetting resin layer and the thermoplastic resin layer are observed as two areas different in contrast.

Figure 3:
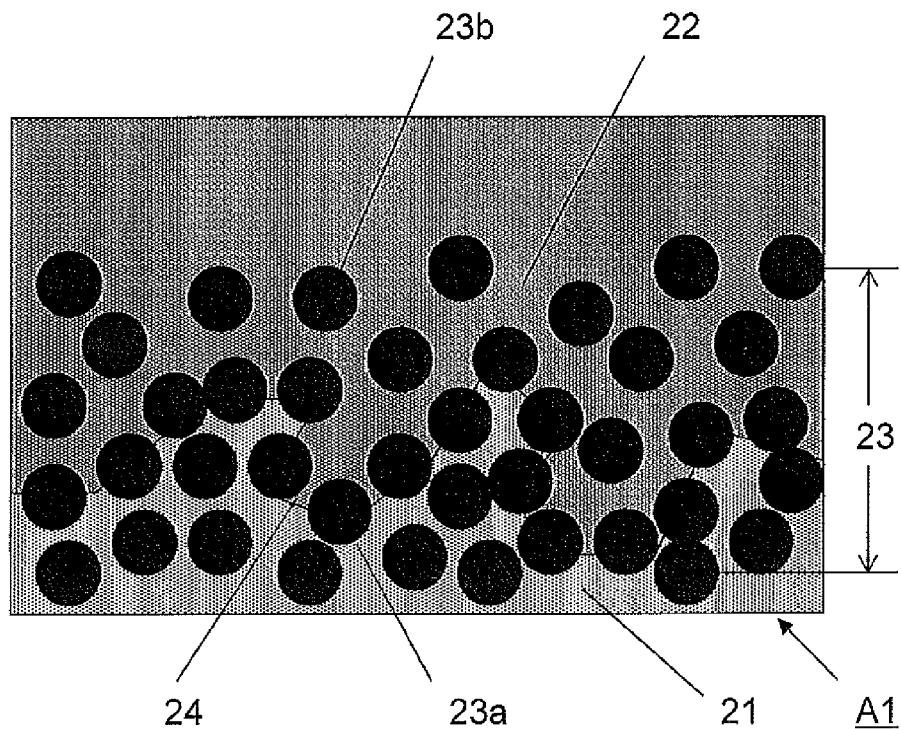
FIG. 3 is a typical sectional view showing a test piece obtained by a first test for verifying the structure of an example of the layered product of the invention.

An observation result of the layered product A1 of the invention is shown in FIG. 3. FIG. 3 shows a state where the resin of the thermoplastic resin layer 22 goes into the clearances among the numerous filaments 23a and 23b constituting the groups of reinforcing fibers 23, and further a state where the interface 24 between the thermosetting resin layer 21 and the thermoplastic resin layer 22 is rugged. The existence of the rugged interface 24 including numerous filaments assures the strong bonding between the thermoplastic resin layer 21 and the thermoplastic resin layer 22.

Figure 4:
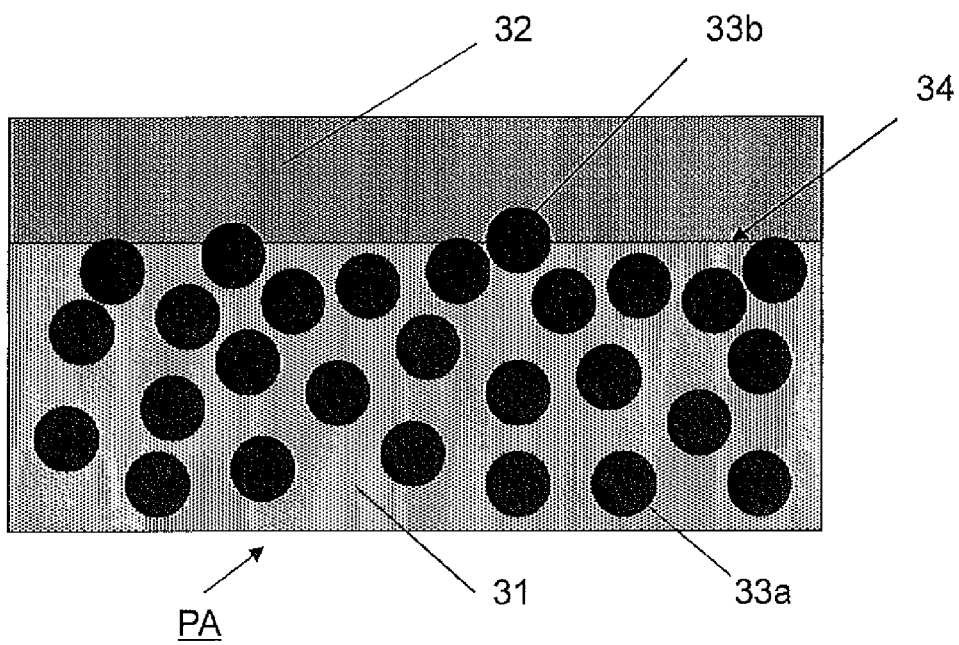
FIG. 4 is a typical sectional view showing a test piece obtained by a first test for verifying the structure of a comparative example of a layered product.

An observation result of the conventional layered product PA is shown in FIG. 4. FIG. 4 shows a state where the resin of the thermoplastic resin layer 32 does not go into the clearances among the numerous filaments 33a and 33b constituting the groups of reinforcing fibers 33, and further a state where the interface 34 between the thermosetting resin layer 31 and the thermoplastic resin layer 32 is almost straight. The interface 34 has an almost straight line form, and the numerous filaments are not substantially positioned at the interface. Therefore, the adhesive strength between the thermosetting resin layer 31 and the thermoplastic resin layer 32 in the conventional layered product PA against the forces acting from outside is far lower than that of the layered product A1 of the invention.

The second testing method is based on the observation of a cross section of the surface layer portion of a layered product remaining after extracting and removing the thermoplastic resin using a solvent, by a scanning electron microscope (SEM) or transmission electron microscope (TEM). The observation of the cross section can be made, as required, based on a photograph showing the cross section. A layered product is cut into a piece with a length of about 10 mm and a width of about 10 mm, as a test piece. In this test piece, the thermoplastic resin layer is sufficiently washed with a good solvent for the resin constituting the layer, for removing the thermoplastic resin, to form a test piece for observation. The cross section of the prepared test piece is observed using an SEM (or TEM).

Figure 5:
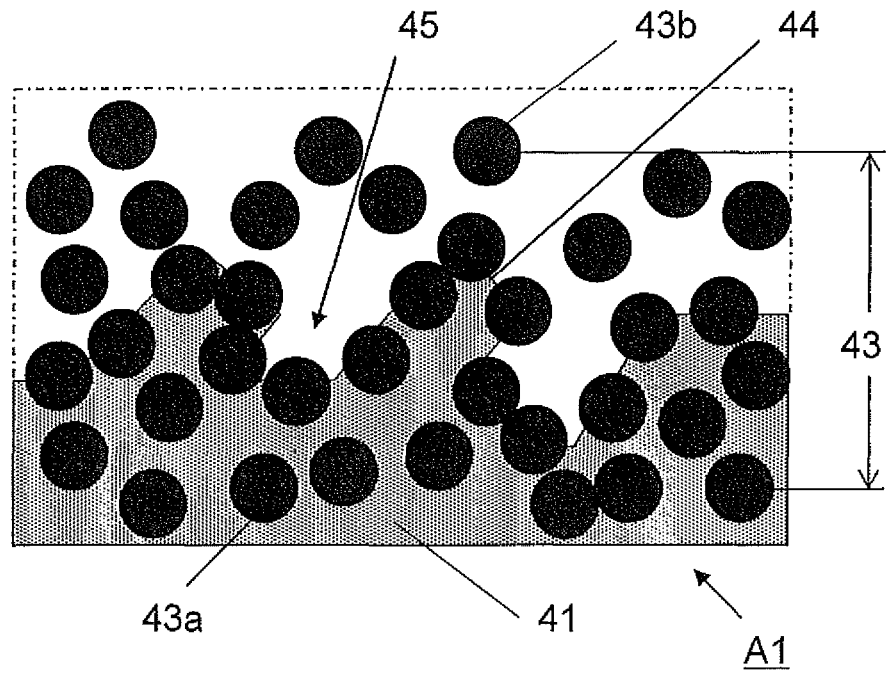
FIG. 5 is a typical sectional view showing a test piece obtained by a second test for verifying the structure of an example of the layered product of the invention.

An observation result of the layered product A1 of the invention is shown in FIG. 5. In FIG. 5, the thermosetting resin layer 41 having the filaments 43a among the groups of reinforcing fibers 43 exist, but the thermoplastic resin layer that existed to form the rugged interface 44 with the thermosetting resin layer 41 does not exist, since it was removed using a solvent when the test piece was prepared. The ruggedness of the interface 44 can be observed, and the filaments 43b among the groups of reinforcing fibers 43 are observed in the position where the thermoplastic resin layer used to exist. In the clearances among these filaments 43b, void 45 is observed. The observation proves that the filaments 43b among the groups of reinforcing fibers 43 existed in the thermoplastic resin layer of the layered product A1.

Figure 6:
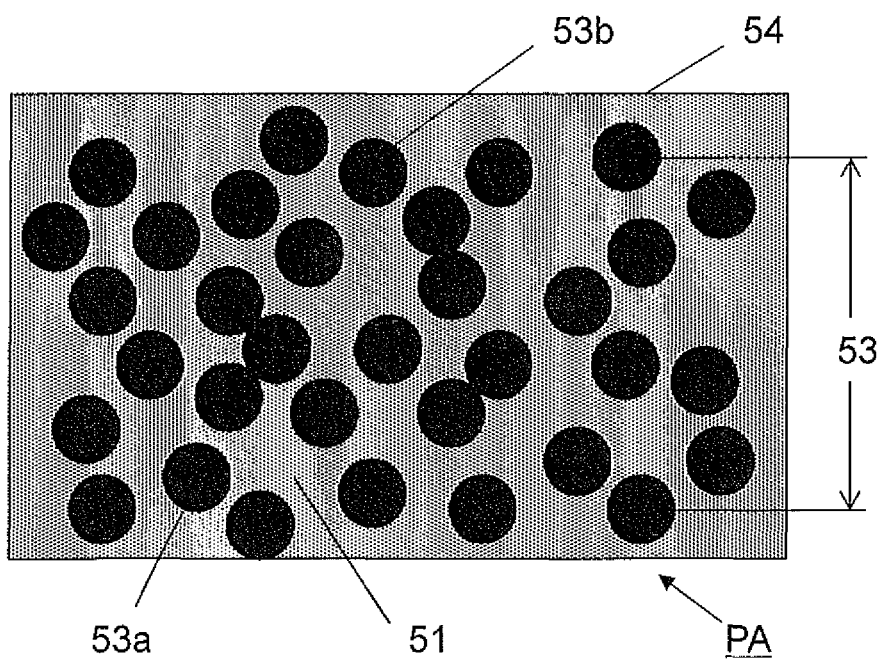
FIG. 6 is a typical sectional view showing a test piece obtained by a second test for verifying the structure of a comparative example of a layered product.

An observation result of the conventional layered product PA based on a similar test piece is shown in FIG. 6. In the conventional layered product PA, the resin of the thermoplastic resin layer does not permeate into the clearances among the filaments 53a and 53b constituting the groups of reinforcing fibers 53 positioned in the thermosetting resin layer 51. When the test piece was prepared, the thermoplastic resin layer was removed, and the interface 54 with the thermosetting resin layer 51 was observed as a substantially straight line form, and on the side of the interface 54 where the thermoplastic resin layer existed, the filaments 43b and the void 45 among them as shown in FIG. 5 are not observed.

For the third testing method, a molded object C1 (not shown in the drawings) is prepared by integrally bonding another member as an adhering member E1 (not shown in the drawings) to the layered product A1, and one is forcibly separated from the other, to observe the state of the rupture. This testing method is carried out by forcibly separating at room temperature to ensure that the integrated molded object C1 is ruptured between the layered product A1 and the adhering member B1. The separated adhering member B1 may have the surface layer of the layered product A1 partially remaining to adhere to it. The residue is observed by a microscope.

Figure 7:
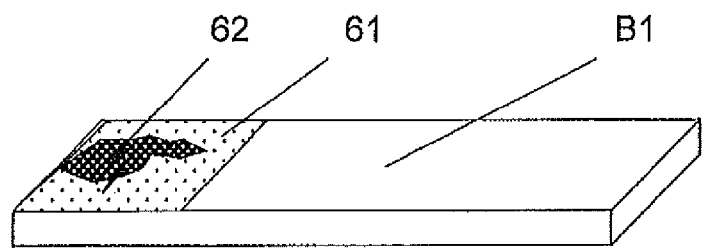
FIG. 7 is a typical perspective view showing a test piece obtained by a third test for verifying the structure of an example of the layered product of the invention.

An example of the state of the test piece obtained by carrying out the third testing method is shown in FIG. 7. FIG. 7 shows a joint portion 61 where the surface of the layered product A1 was bonded to the end of the adhering member B1. Partially in the joint portion 61, a partial residue 62 of the surface layer portion of the layered product A1 is observed. It can be observed that plural filaments coming off from the groups of reinforcing fibers positioned in the surface layer of the layered product A1 exist in the residue 62. On the other hand, in the case where such a residue does not adhere to the adhering member B1 or in the case where filaments are not observed in the residue, the resin of the thermoplastic resin layer on the surface does not permeate into the clearances among the groups of reinforcing fibers in the layered product. Such a layered product does not have the working effect of the invention.

The structural feature of the layered product of the invention can be verified by at least one of the above-mentioned testing methods.

For the purpose of enhancing the bonding strength of the layered product A1 of the invention to another adhering member B1, it is preferred that the maximum thickness Tpf of the area where the continuous filaments 13b exist in the thermoplastic resin layer 12 is 10 μm or more. More preferred is 20 μm or more, and further more preferred is 40 μm or more. The maximum thickness Tpf-max is defined as the distance (Tpf-max) between the outermost (surface side) filament 13b-out kept in contact with the resin of the thermoplastic resin layer 12 in the thickness direction of the thermoplastic resin layer 12 and the innermost filament 13b-in-max kept in contact with the resin of the thermoplastic resin layer 12 in the region where the penetrating thickness of the resin of the thermoplastic resin layer 12 from the surface is largest. The maximum thickness Tpf-max can be measured on a photograph of SEM or TEM obtained by the first or second testing method. If the maximum thickness Tpf-max is 1,000 μm at the largest, the effect of the invention can be sufficiently achieved.

The minimum thickness Tpf-min is defined as the distance (Tpf-min) between the outermost (surface side) filament 13b-out kept in contact with the resin of the thermoplastic resin layer 12 in the thickness direction of the thermoplastic resin layer 12 and the innermost filament 13b-in-min kept in contact with the resin of the thermoplastic resin layer 12 in the region where the penetrating thickness of the resin of the thermoplastic resin layer 12 from the surface is smallest.

In the layered product A1, it is preferred that the interface 14 between the thermosetting resin layer 11 and the thermoplastic resin layer 12 exists among the groups of reinforcing fibers 13 consisting of numerous filaments 13a and 13b paralleled in one direction as shown in FIG. 2. In the case where the groups of reinforcing fibers 13 exist in plural layers in the thickness direction in the layered product A1, it is usually sufficient that the interface 14 exists in the groups of reinforcing fibers 13 of the outermost layer.

It is preferred that the resin forming the thermosetting resin layer 11 of the layered product A1 of the invention underwent the setting reaction, to ensure that the layered product A1 obtained has excellent mechanical properties. It is preferred that the glass transition temperature of the thermosetting resin is 60° C. or higher. More preferred is 80° C. or higher, and further more preferred is 100° C. or higher. The glass transition temperature is measured by a publicly known measuring method using a differential scanning calorimeter (DSC). For example, the thermosetting resin layer 11 of the layered product A1 is cut out without separating the groups of reinforcing fibers 13, to prepare a test piece, and from the endothermic peak of the test piece, the glass transition temperature is specified. As the setting reaction of the thermosetting resin progresses, the glass transition temperature shifts toward a higher temperature, and accordingly, the endothermic peak tends to be smaller.

When the layered product A1 of the invention is bonded to another adhering member B1 for making an integrated molded object, it is necessary that the bonding is achieved in a state where the thermoplastic resin layer 12 provided on the surface of the layered product A1 and the adhering member B1 face each other, for obtaining an excellent bonding effect. The area S of the thermoplastic resin layer 12 provided on the surface of the layered product A1 is decided in response to the area that can assure the adhesive strength to the adhering member B1 planned to be bonded. The area S is not required to be larger than necessary. However, in view of processability in the production of the integrated molded object, the thermoplastic to resin layer 12 can also exist on the entire surface where the layered product A1 and the adhering member B1 are kept in contact with each other.

In the case where the thermoplastic resin layer 12 is partially formed on the surface of the layered product A1, it is preferred that the area of the thermoplastic resin layer 12 occupying the surface area of the layered product A1 is from 0.1 to 50%. A more preferred range is from 1 to 40%, and a further more preferred range is from 10 to 30%. Moreover, in view of the warping of the layered product A1, as shown in FIG. 1, the thermoplastic resin layer 12 can also be formed on each surface of the layered product A1. In this case, since the layer structure of the layered product A1 is symmetrical, the dimensional stability of the layered product A1 is good.

The layered product A1 of the invention does not have positive adhesive strength to another adhering member B1 at room temperature, but if the thermoplastic resin layer 12 is molten by heating or the like, the layered product A1 can be easily bonded to the other adhering member B1, for allowing the layered product A1 and the adhering member B1 to be integrated.

It is preferred that the bonding strength AS of the layered product A1 of the invention specified in ISO4587 is 6 MPa or higher at room temperature. More preferred is 8 MPa or higher, and further more preferred is 10 MPa or higher. The upper limit of the bonding strength AS is not especially limited, but if it is 30 MPa or lower, the effect of the invention can be sufficiently achieved.

The test piece for measuring the bonding strength AS is prepared by the method explained below.

Figure 8:
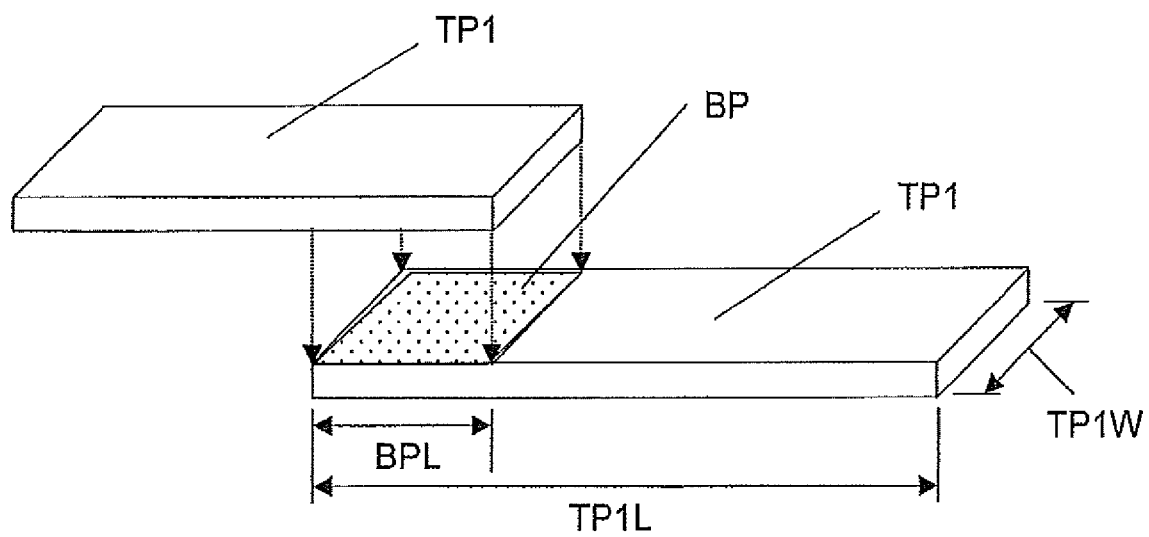
FIG. 8 is a perspective view showing how to prepare a test piece used for a bonding strength test of a layered product according to ISO4587.

The form and size of a test piece TP1 are shown in FIG. 8 as specified in ISO4587. The length TP1L of a test piece TP1 is 100 mm, and width TP1W is 25 mm. Two test pieces TP1 are prepared. If it is difficult is to cut out test pieces with these dimensions in view of the form of the layered product A1, test pieces with dimensions proportionally reduced from the dimensions shown in FIG. 8 can be used instead.

Two prepared test pieces TP1 are positioned to face each other in such a manner that the respective thermoplastic resin layers 12 are bonded to form a joint. The length BPL of the joint BP is 12.5 mm. Both the test pieces TP1 are heated up to a temperature at which the resin of the thermoplastic resin layers 12 is sufficiently molten, and are bonded to each other, and while they are clamped, they are cooled to prepare a tensile test piece having both the test pieces bonded together. The tensile test piece is used to carry out a tensile test. It is confirmed that rupture occurs near the joint (near the boundary), and the value obtained by dividing the strength (kN) by the surface area of the joint is the bonding strength (MPa). In the preparation of the tensile test piece, the bonding means is not especially limited if both the test pieces TP1 can be bonded to each other. The bonding means can be such a bonding method as vibration welding or ultrasonic welding. The clamping method is not especially limited either. For example, a method of pressing the joint BP at a pressure of 0.1 to 1 MPa can be used.

Second Embodiment of the Layered Product of the Invention

Figure 9:
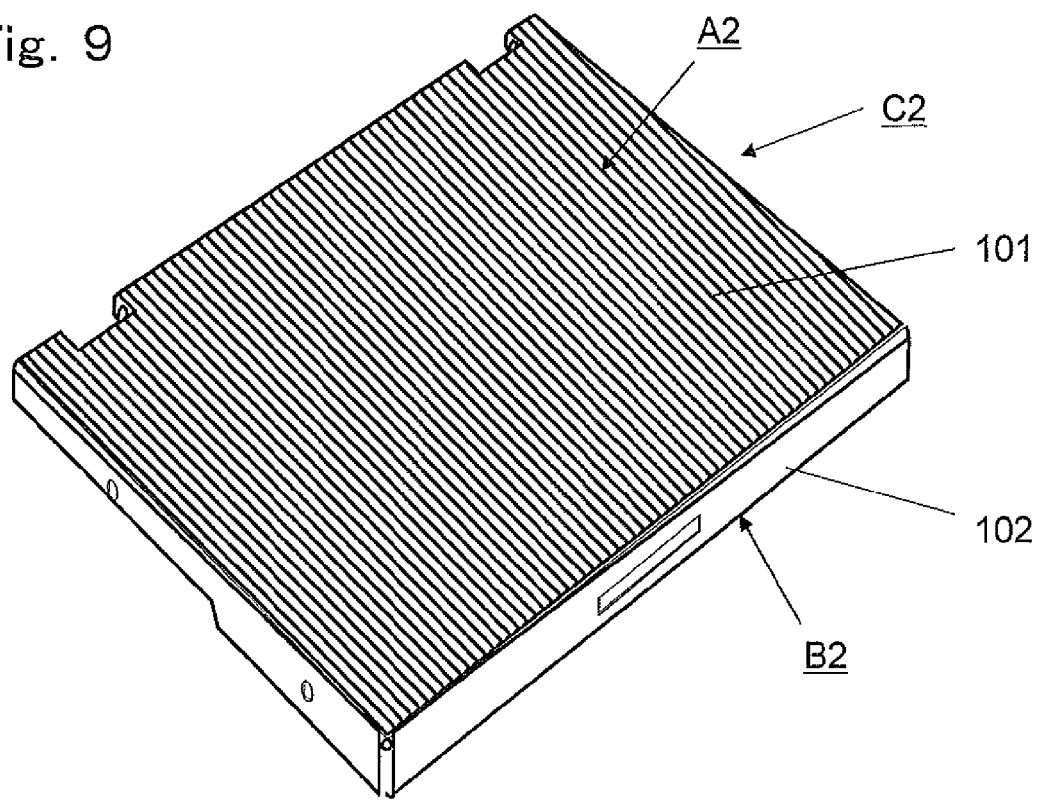
FIG. 9 is a perspective view showing a model of a housing for an electric or electronic apparatus as an example of the integrated molded object of the invention.

FIG. 9 shows an integrated molded object C2. In FIG. 9, the molded object C2 consists of a layered product A2 of the invention forming a top board 101 and a structural member B2 forming a frame 102. In the molded object shown in FIG. 9, the top board 101 (layered product A2) is integrated with the top faces of the rise wall portions of the frame 102 (structural member B2), and it is an example of the electromagnetic-shielding molded object C2 such as a personal computer housing.

In FIG. 9, the layered product A2 (top board 101) of the invention as a component of the electromagnetic-shielding molded object C2 consists of a thermosetting resin as the matrix resin and groups of conductive continuous reinforcing fibers arranged in the resin, and has a film made of a thermoplastic resin composition described later formed at least partially on the surface of the layered product A2 (top board 101) (since this surface is the bottom face of the layered product A2 (top board 101), FIG. 9 does not show this film).

The layered product A2 refers to a layered product in which plural resin composition sheets containing reinforcing fibers different in arranged direction are layered in the thickness direction for achieving the mechanical properties. The conductive reinforcing fibers are arranged in a length of 10 mm or more at least in one direction in the layered product A2. However, the reinforcing fibers are not necessarily required to be continuous over the entire length of the layered product A2 but can also be broken halfway.

The conductive fibers can be provided in such a style as filament bundles, a cloth consisting of the filament bundles, unidirectional filament bundles, or a unidirectional cloth consisting of the unidirectional filament bundles. A cloth or unidirectional filament bundles can be suitably used. The reinforcing fibers can be provided in any one of the styles or as two or more styles used together.

The layered product A2 of the invention is desired to ensure that when it is integrated with another member, for example, a structural member B2 (frame 102) by bonding through a film made of a thermoplastic resin composition, to make an integrated molded object, the normal bonding strength at the joint is 10 MPa or higher at 40° C. and lower than 10 MPa at 140° C.

The integrated molded object is used as a housing for mainly accommodating a heating unit. So, about 40° C. is an ordinary working environment, and in view of the bonding strength capable of enduring the use in the environment, it is preferred that the normal bonding strength at 40° C. is 10 MPa or higher. More preferred is 13 MPa or higher, and further more preferred is 18 MPa or higher. If the normal bonding strength at 40° C. is lower than 10 MPa, it can happen that when the integrated molded object C2 receives a strong impact due to fall or the like, it is broken at the joint between the layered product A2 and the structural member B2. The upper limit of the normal bonding strength at 40° C. is not especially limited, but if it is 30 MPa or lower, the effect of the invention can be sufficiently achieved.

Furthermore, the layered product A2 of the invention has a feature that the normal bonding strength at 140° C. is very lower than the normal bonding strength at 40° C. The normal bonding strength at 140° C. is lower than 10 MPa. Preferred is 5 MPa or lower, and more preferred is 1 MPa or lower.

Usually as the thermosetting resin of the layered product A2, a thermosetting resin with a glass transition point (Tg) of 130 to 150° C. in atmosphere (atmospheric pressure, 50% RH) is used. The reason is that since the layered product A2 is mainly used for a personal computer, it does not happen that the molded object for this application is used in a temperature environment of higher than 150° C. With attention paid to this fact, the normal bonding strength of the layered product A2 of the invention at 140° C. is kept at lower than 10 MPa. In the case where the layered product A2 of the invention satisfies this requirement, when the molded object C2 consisting of the layered product A2 and the other member B2 bonded to each other through the thermoplastic resin composition formed on the surface of the layered product A2 is scrapped as waste, it can be easily disassembled into the respective parts, for example, the top board 101 and the frame 102 in a temperature environment of about 140° C. As a result, there is a working effect that the work of sorting into respective parts is also easy. Thus, the reuse of parts can be promoted.

Figure 10:
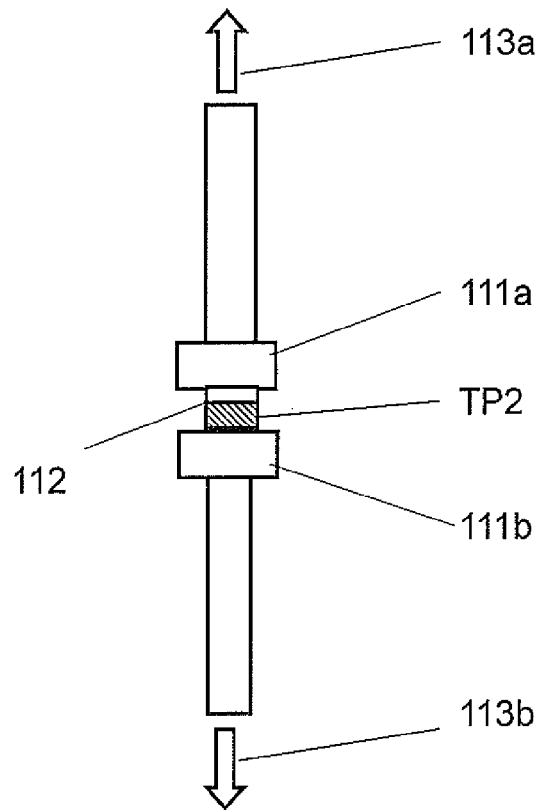
FIG. 10 is a typical front view showing an important portion of a tester used for measuring the normal bonding strength of a layered product.

The method for measuring the normal bonding strength is explained in reference to FIG. 10. A test piece TP2 for measurement is cut out from the portion where the layered product A2 and the structural member B2 of the integrated molded object C2 are bonded to each other for integration. The top and bottom ends of the test piece TP2 are fixed to the arresting pieces 111a and 111b of an ordinary tensile tester, and the test piece TP2 is pulled in the directions (arrows 113a and 113b) perpendicular (90 degrees) to the joint interface 112 of the is test piece TP2. The maximum load at which the joint interface 112 ruptures is divided by the area of the joint interface 112, to obtain a tensile strength (T) MPa, and this value is employed as the normal bonding strength. The actually used tensile tester was "Instron" (trademark) Model 5565 Universal Testing Machine (produced by Instron Japan Co., Ltd.), and the stress rate in the test was 1.27 mm/min.

The tensile test is carried out in a laboratory where the ambient temperature can be adjusted, with the ambient temperature set at 40° C. and 140° C. Before start of the test, the test piece TP2 is kept free from the load of the tensile test for at least 5 minutes. It is preferred to dispose a thermocouple on the test piece TP2, for confirming that the temperature has become equivalent to the ambient temperature, before initiating the tensile test.

In the case where the molded object C2 can be held by the arresting pieces 111a and 111b of the tensile tester, the molded object C2 is held between the arresting pieces 111a and 111b as it is, for carrying out a tensile test. In the case where it cannot be held, the molded object C2 is coated with an acrylic adhesive (Three Bond 1782, produced by Three Bond Co., Ltd.) and is allowed to stand at 23±5° C. and 50±5% RH for 4 hours, for bonding the molded object to the arresting pieces 111a and 111b. As for the test result, only when peeling occurs at the joint between the layered product A2 and the structural member B2 without any rupture occurring at the joint between either of the arresting pieces and the molded object, the measured value is employed. The reason is that in the case where peeling occurs at the joint between is either of the arresting pieces and the molded object, the correct bonding strength value cannot be obtained.

It is preferred that the average thickness of the film formed on the layered product A2 of the invention is from 0.1 to 1,000 µm. A more preferred range is from 1 to 200 µm, and a furthermore preferred range is from 10 to 50 µm. The average thickness of the film refers to the maximum thickness Tpf shown in FIG. 2, and the average thickness of the film is measured by the same method as the method for measuring the maximum thickness Tpf. If the thickness of the film is not constant, the thicknesses of several optional points should be measured, and the obtained values should be averaged to obtain the thickness of the film. If the average thickness is in the aforesaid preferred range, the normal bonding strength at 40° C. can be more reliably achieved.

Examples of the material of the groups of reinforcing fibers used in the layered product A1 of the invention or in the layered product A2 of the invention include glass fibers, carbon fibers, metal fibers, aromatic polyamide fibers, polyaramide fibers, alumina fibers, silicon carbide filers and boron fibers. Any one of the materials can be used or two or more of the materials can also be used together. The fibers can also be treated on the surfaces. Examples of the surface treatment include metal coating treatment, treatment using a coupling agent, treatment using a sizing agent, additive addition treatment, etc. These fibers also include conductive fibers. As the fibers, carbon fibers are preferably used since they have a small specific gravity, high strength and high modulus.

As the thermosetting resin used in the layered product A1 of the invention or the layered product A2 of the invention, preferred is a thermosetting resin that gives excellent stiffness and strength to the molded object C1 or C2 produced using the layered product A1 or A2. Examples of the thermosetting resin include unsaturated polyesters, vinyl esters, epoxies, phenols Cresol type), urea-melamine, polyimides, their copolymers and modification products, and resins obtained by blending at least two of the foregoing. For enhancing the impact resistance, an elastomer or rubber component can also be added to the thermosetting resin. Especially an epoxy resin is preferred in view of the mechanical properties of the molded object C1 or C2.

Examples of the thermoplastic resin for forming the thermoplastic resin layer 12 of the layered product A1 of the invention or the film of the layered product A2 of the invention include polyamide resins, polyester resins, polycarbonate resins, styrene-based resins, ethylene-vinyl acetate copolymer (EVA) resin, polyurethane resins, acrylic resins, polyolefin resins, polyphenylene sulfide (PPS) styrene resins, their copolymers and modification products, and resins obtained by blending two or more of the foregoing. As required, for example, additives and filler can also be added. As the thermoplastic resin, considering the adhesiveness to the adhering member B1 or B2 to be integrated, it is desirable to select a resin close to the composition of the adhering portion. For example, in the case where the layered product A1 or A2 is bonded to an adhering member B1 or B2 composed of a polyamide-based resin, it is preferred that the thermoplastic resin layer or film formed on the surface of the layered product A1 or A2 is a polyamide resin.

It is preferred that the melting point or softening point of the thermoplastic resin used is 50° C. or higher, considering the practical use of the molded object and the processability in the production of the layered product. Furthermore, since it is necessary that the thermoplastic resin is molten or softened at the temperature at which the thermosetting resin is set, it is preferred that the melting point or softening point is 300° C. or lower. It is more preferred that the melting point of softening point of the thermoplastic resin is from 100 to 250° C., and a furthermore preferred range is from 125 to 220° C. The melting point refers to the value measured at a heating rate of 10° C./min by DSC according to JIS K 7121. The softening point refers to the value obtained by measuring the Vicat softening temperature according to JIS K 7206.

It is preferred that the content of the continuous conductive reinforcing fibers in the layered product A1 of the invention or the layered product A2 of the invention is from 5 to 75 vol % for satisfying all of moldability, mechanical properties and electromagnetic-shielding performance. A more preferred range is from 30 to 75 vol %, and a further more preferred range is from 50 to 70 vol %.

The material of the structural member B1 or B2 as a component of the integrated molded object C1 or C2 is not especially limited if it has thermal adhesiveness at the joint with the layered product A1 or A2. A metallic material obtained by treating the surface of aluminum, iron, magnesium, titanium or any of their alloys to make it thermally adhesive can also be used.

If is preferred that the structural member B1 or B2 is composed of a thermoplastic resin composition containing reinforcing fibers. Examples of the reinforcing fibers include polyacrylonitrile-based carbon fibers, rayon-based carbon fibers, lignin-based carbon fibers, pitch-based carbon fibers, graphite fibers, glass fibers, metal fibers such as aluminum fibers, brass fibers and stainless steel fibers, and inorganic fibers such as silicon carbide fibers and silicon nitride fibers.

The thermoplastic resin used for the structural member B1 or B2 is not especially limited. Examples of the thermoplastic resin include polyesters such as polyethylene terephthalate (PET), polybutylene terephthalate (PBT), polytrimethylene terephthalate (PTT), polyethylene naphthalate (PEN) and liquid crystal polyesters, polyolefins such as polyethylene (PE), polypropylene (PP) and polybutylene, styrene-based resins, polyoxymethylene (POM), polyamides (PA), polycarbonates (PC), polymethylene methacrylate (PMMA), polyvinyl chloride (PVC), polyphenylene sulfide (PPS), polyphenylene ether (PPE), modified PPE, polyimides (PI), polyamideimides (PAI), polyether imides (PEI), polysulfone (PSU), modified PSU, polyethersulfones, polyketones (PK), polyetherketones (PEK), polyetheretherketones (PEEK), polyetherketoneketones (PEKK), polyallylates (PAR), polyether nitriles (PEN), phenol-based resins, phenoxy resin, fluorine-based resins such as polytetrafluoroethylene, furthermore, thermoplastic elastomers based on polystyrene, polyolefin, polyurethane, polyester, polyamide, polybutadiene, polyisoprene and fluorine, etc., their copolymers and modification products, and resins obtained by blending at least two of the foregoing. An elastomer or rubber component can also be added to the thermoplastic resin, for enhancing the impact resistance. In view of heat resistance and chemicals resistance, PPS resin can be preferably used, and in view of the appearance and dimensional stability of the molded object, polycarbonate resins and styrene-based resins can be preferably used. In view of the strength and impact resistance of the molded object, polyamide resins can be preferably used. A filler and additive can also be added to the thermoplastic resin. One of the additives is a conductivity imparting agent. Examples of the conductivity imparting agent include carbon black, amorphous carbon powder, natural graphite powder, artificial graphite powder, expanded graphite powder, pitch microbeads, vapor grown carbon fibers, and carbon nanotubes. The conductivity imparting agent can be preferably used for the purpose of enhancing the electromagnetic-shielding performance when the molded object C1 or C2 is used as a housing of a personal computer.

The process for producing the integrated molded object C1 or C2 using the layered product A1 or A2 of the invention is not especially limited. For example, the production process comprises the steps of bonding and sticking the structural member B1 or B2 at a temperature of higher than the melting point or softening point of the thermoplastic resin layer 12 or film used as a component of the layered product A1 or A2, and cooling.

The procedure for bonding the layered product A1 or A2 and the structural member B1 or B2 to each other is not especially limited. Examples of the method include (i) a method comprising the steps of molding the layered product A1 or A2 beforehand, and molding and concurrently bonding the structural member B1 or B2 to the layered product for integration, (ii) a method comprising the steps of molding the structural member B1 or B2 beforehand, and molding and concurrently bonding the layered product A1 or A2 to the structural member for integration, and (iii) a method comprising the steps of molding the layered product A1 or A2 and the structural member B1 or B2 beforehand respectively separately, and bonding them to each other for integration.

Examples of the integration method include a method of mechanically fitting the layered product A1 or A2 and the structural member B1 or B2 to each other for integration, a method of integrating both using a mechanical bonding means such as bolts or screws, and a method of integrating both using a chemical bonding means such as an adhesive. Two or more of these integration methods can also be used together as required.

As a particular example of the integration method (i), the layered product A1 or A2 is produced by press molding, processed or post-treated to achieve a predetermined size as required, and inserted into a mold for injection molding, and the material destined to be the structural member B1 or B2 is injection-molded in the mold.

As a particular example of the integration method (ii), the structural member B1 or B2 is produced by injection molding, processed or post-treated to achieve a predetermined size as required, and inserted into a press mold, and subsequently the press mold is heated to a process temperature. Then, a base material in which a thermoplastic resin layer is formed on the surface of a prepreg destined to be the layered product A1 or A2, composed of a thermosetting resin not yet set and groups of conductive fibers consisting of numerous continuous filaments, is laid up, and vacuum bag molding is carried out at a temperature higher than the melting point of the thermoplastic resin.

As a particular example of the integration method (iii), the layered product A1 or A2 is produced by press molding, and processed or post-treated to achieve a predetermined size as required. Separately, the structural member B1 or B2 is produced by injection molding. They are integrated according to the same method as the integration method (ii) by thermal bonding or ultrasonic welding, etc.

In view of productivity of the integrated molded object C1 or C2, insert injection molding or outsert injection molding in the integration method (i) can be preferably used. In view of shape stability and preciseness of the joint, the integration method (iii) is can be preferably used and thermal welding, vibration welding, ultrasonic welding and laser welding can be preferably used.

The molded object C1 or C2 integrated by any of the above-mentioned methods is lighter in weight to such an extent that cannot be realized in the conventional integration with a metallic material. Any of the above-mentioned integration methods can exhibit excellent adhesive strength between the layered product A1 or A2 and the structural member B1 or B2, and solves the problem of peeling between members, which has been a problem in the integration with a thermosetting resin composition.

To maintain the form of the molded object C1 or C2, an adhesive region (adhesive layer) exists at least partially at the interface between the layered product A1 or A2 and the structural member B1 or B2. It is preferred that adhesive region (adhesive layer) covers an area of 50% or more of the area of the joint interface. More preferred is 70% or more, and further more preferred is the same area as the entire area of the joint interface.

The integrated molded object C1 or C2 is obtained by integrating the layered product A1 or A2 and the structural member B1 or B2, and the shape of the molded object C1 or C2 is not especially limited. The shape may also have a curved surface, rib, hinge, boss or hollow portion. The integrated molded object C1 or C2 can also be treated for being modified on the surface by plating, coating, vapor deposition, insertion, stamping or laser irradiation, etc.

The applications of the integrated molded object C1 or C2 include products of the fields requiring electromagnetic-shielding performance. Examples of the products include parts, members and housings of electric or electronic apparatuses such as various gears, various cases, sensors, LED lamps, connectors, sockets, resistors, relay cases, switches, coil bobbins, capacitors, optical pickups, vibrators, various terminal boards, transformers, plugs, printed circuit boards, tuners, speakers, microphones, headphones, small motors, magnetic head bases, power modules, semiconductors, displays, FDD carriages, chassis, HDDs, MOs, motor brush holders, parabolic antennas, notebook personal computers, cellular phones, digital still cameras, PDAs, portable MDs and plasma displays, parts, members and housings of household or office products typified by telephone sets, facsimiles, VTRs, copiers, television sets, irons, hair dryers, rice cookers, electronic ovens, acoustic apparatuses, cleaners, toiletry articles, laser discs, compact discs, illumination, refrigerators, air conditioners, typewriters and word processors, parts, members and housings of game and amusement products such as pinball machines, slot machines and game machines, parts, members and housings relating to optical apparatuses and precision machines such as microscopes, binoculars, cameras and timepieces, medical applications such as X-ray cassettes, parts, members and external boards relating to motor vehicles and two-wheelers such as motor parts, alternator terminals, alternator connectors, IC regulators, potentiometer bases for light-deer, suspension parts, exhaust gas valves and other various valves, various pipes relating to fuels, exhaust systems and intake systems, air intake nozzle snorkels, intake manifolds, various arms, various frames, various hinges, various bearings, fuel pumps, gasoline tanks, CNG tanks, engine cooling water joints, carburetor main bodies, carburetor spacers, exhaust gas sensors, cooling water sensors, oil temperature sensors, brake pad wear sensors, throttle position sensors, crankshaft position sensors, air flow meters, thermostat bases for air conditioners, room heating air flow control valves, brush holders for radiator motors, water pump impellers, turbine vanes, wiper motor parts, distributors, starter switches, starter relays, transmission wire harnesses, window washer nozzles, air conditioner panel switch boards, coils for electromagnetic valves relating to fuels, fuse connectors, battery trays, AT brackets, head lamp supports, pedal housings, steering wheels, door beams, protectors, chassis, frames, arm rests, horn terminals, step motor rotors, lamp sockets, lamp reflectors, lamp housings, brake pistons, noise shields, radiator supports, spare tire covers, sheet shells, solenoid bobbins, engine oil filters, ignition device cases, under covers, scuff plates, pillar trims, propeller shafts, wheels, fenders, fascias, bumpers, bumper beams, bonnets, aero parts, platforms, cowl louvers, roofs, instrument panels, spoilers and various modules, parts, members and outer boards relating to aircraft such as landing gear pods, winglets, spoilers, edges, ladders, elevators and ribs, parts and members relating to sports such as various rackets, golf club shafts, yachts, boards, skiing articles, fishing rods and bicycles, parts relating to artificial satellites, architectural applications such as panels. The integrated molded object C1 or C2 is useful for such various applications.

Among them, the integrated molded object C1 or C2 can be preferably used for the applications requiring light weight, high stiffness, complicatedly shaped portions and electromagnetic-shielding performance, such as electric and electronic apparatuses, office automation apparatuses, household electric appliances and medical apparatuses, for example, personal computers, displays, cellular phones and portable information terminals.

Furthermore, complicatedly shaped portions can be easily molded in a large molded object with excellent mechanical properties, the integrated molded object can also be suitably used for parts, members and external panels of motor vehicles, two-wheelers, bicycles, aircraft and architecture.

Since the electromagnetic-shielding molded object formed by using the layered product of the invention has excellent electromagnetic-shielding performance, it is suitable as a housing or external member of an electric or electronic apparatus, and furthermore suitable as a housing of a notebook personal computer or portable information terminal requiring a wide projected area with a small thickness. In the case where the electromagnetic-shielding molded object is used as such a housing, in view of electromagnetic-shielding performance, it is preferred that the layered product A2 occupies at least a part of the top face of the molded object C2 used as the housing. It is more preferred that the layered product A2 occupies 50% or more of the projected area of the top face, and it is especially preferred that the layered product A2 occupies 70% or more of the projected area of the top face.

Figure 11:
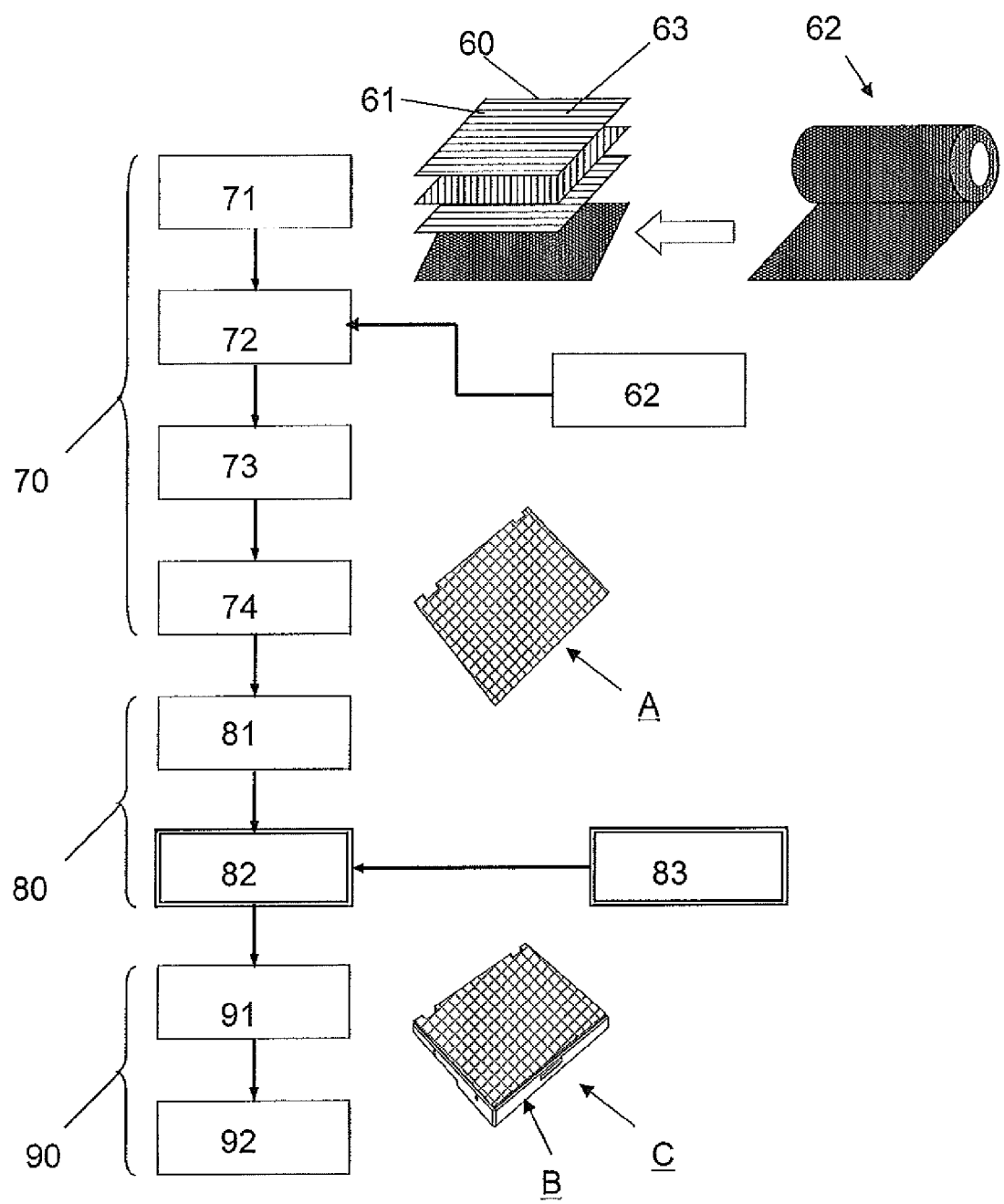
FIG. 11 is a flowchart for illustrating a process for producing the integrated molded object of the invention.
Figure 12:
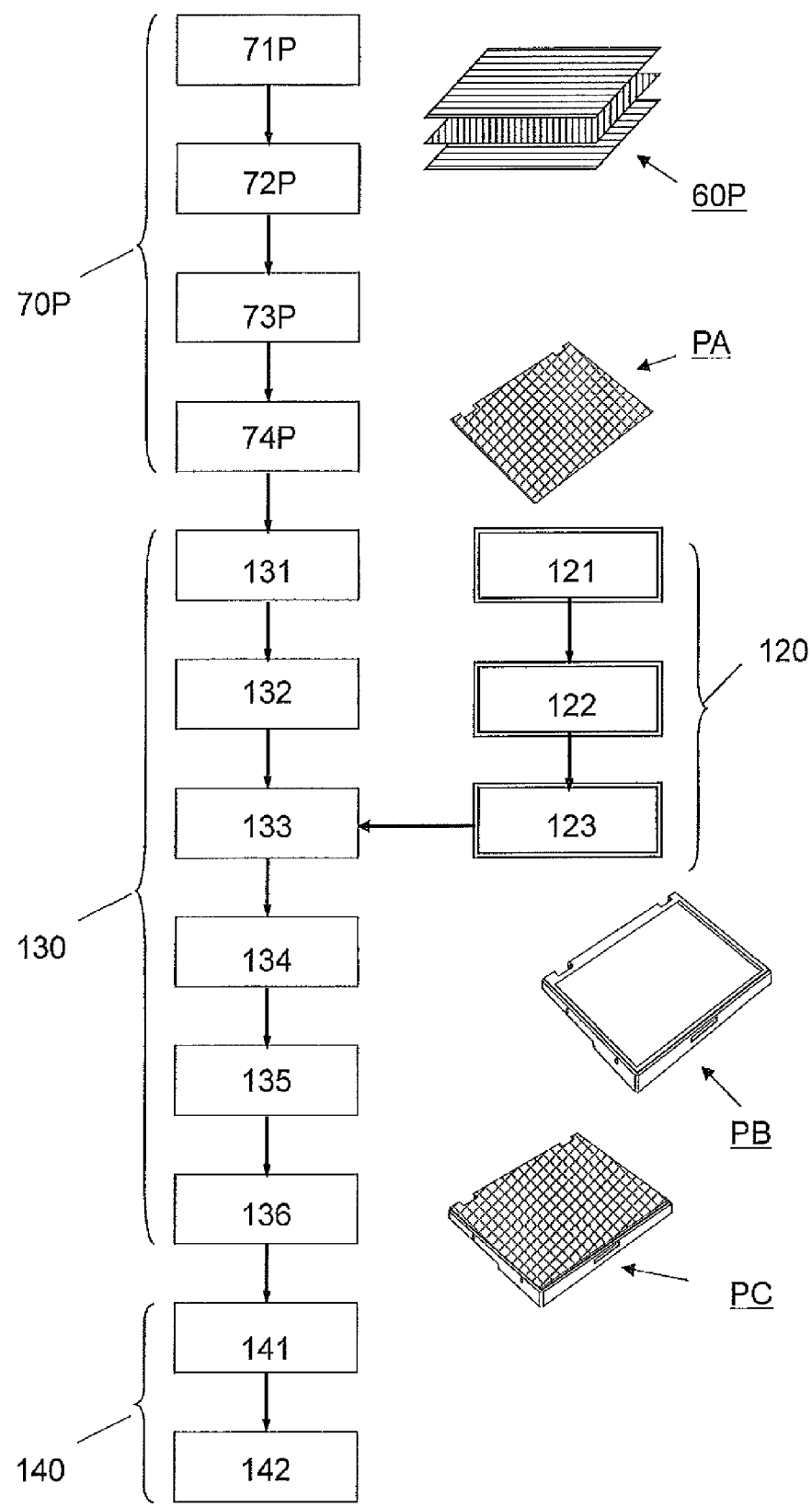
FIG. 12 is a flowchart for illustrating a process for producing a conventional integrated molded object.

The process for producing the layered product A1 or A2 of the invention is described in reference to FIGS. 11 and 12 that illustrate processes for producing an electronic apparatus housing as a preferred application of the integrated molded object C1 or C2.

FIG. 11 shows an example of the process for producing the layered product 5 of the invention shown in FIG. 1.

The layered product A is produced as described below. A prepreg 60 in which reinforcing fiber bundles 63 consisting of numerous continuous filaments are impregnated with a thermosetting resin 61 as the matrix resin is cut into a predetermined size (step 71). Sheets of the prepreg 60 are laminated at predetermined angles, for example, five sheets are laminated at angles of 0 degree, +45 degrees, 90 degrees, −45 degrees and 0 degree, and a base material 62 for thermal bonding composed of a thermoplastic resin composition is disposed to cover the whole portion or partial portion of the surface, as lamination step 72. Subsequently the thermoplastic resin composition of the base material 62 for thermal bonding is molten to and pressurized concurrently with the setting reaction of the thermosetting resin composition or by preheating before the setting reaction, to mold a thermoplastic resin layer and a thermoplastic resin film, as heat molding step 73 (layered product molding subprocess 70). That is, after the thermoplastic resin composition 62 is disposed as a film on the surface layer of the prepreg 60 consisting of the thermosetting resin composition not yet set and the reinforcing fiber bundles, the thermosetting resin composition is set at a temperature higher than the melting point of the thermoplastic resin composition 62. Thus, the layered product A in which the thermosetting resin composition 61 and the thermoplastic resin composition 62 are well bonded to each other with the reinforcing fiber bundles 63 existing among them can be obtained. The reason why the adhesive strength is high is that the thermoplastic resin composition in a state of being molten permeates through the numerous filaments constituting the reinforcing fiber bundles against the thermosetting resin composition in a state of being set, to form a rugged interface between the thermosetting resin composition and the thermoplastic resin composition with numerous filaments existing among them. Therefore, even if the thermoplastic resin composition is molten and laminated after the thermosetting resin composition has been set, it is difficult to obtain the layered product of the invention.

The particular method for producing the layered product A is not especially limited. Publicly known molding methods using a thermosetting resin such as hand lay-up molding method, spray-up molding method, vacuum bag molding method, pressure molding method, autoclave molding method, press molding method and transfer molding method, and publicly known methods using a thermoplastic resin such as simple press molding method and stamping method can be used. In is view of processability and mechanical properties, vacuum bag molding method, press molding method and transfer molding method can be suitably used.

For enhancing the bonding strength between the layered product A and the structural member B in the integrated molded object C, it is preferred to apply a pressure of 0.1 MPa or higher when the molten thermoplastic resin composition 62 is permeated among the filaments of the reinforcing fiber bundles 63. A more preferred pressure is 0.5 MPa or higher, and a further more preferred pressure is 1 MPa or higher.

To produce the integrated molded object C using the obtained layered product A, the layered product A is cut out to achieve a predetermined size as post-processing (step 74), for example, by punching, to prepare a layered product A to be used for producing the molded object C.

Then, the layered product A is inserted into a mold for injection molding (step 81), and a thermoplastic resin composition 83 is injected into the mold as a material for forming a structural member B such as a boss, rib, hinge or frame, for outsert molding (step 82). The molded object C obtained by this simple integration subprocess 80 is mended as required in a mending step 91 to obtain a product (post-processing process 90). The obtained product 92 is the completely integrated molded object C.

FIG. 12 shows a process for producing an integrated molded object PC using a conventional layered product. Sheets of the prepreg consisting of a thermosetting resin composition and reinforcing fiber bundles are laminated to form a layered product PA according to the same molding method as the layered product molding subprocess 70 shown in FIG. 11. In this layered product PA, the thermoplastic resin composition 62 of FIG. 11 does not exist. Since the obtained layered product PA is not thermally adhesive, for example, an adhesive must be used in an integration step for obtaining the integrated molded object PC.

Separately a structural member PB such as a boss, rib, hinge or frame is molded. The structural member PB is obtained, for example, by injection-molding (step 122) a thermoplastic resin composition 121, to obtain a molded member 123 (injection molding subprocess 120). The obtained structural member PB is, as required, treated with a primer (step 131), and coated with an adhesive at the region where the layered product PA is bonded (step 132). The layered product PA is bonded to the structural member PB coated with an adhesive (step 133). Both of them are bonded while they are fixed using a tool (step 134) Then, the integrated product PC is dried for a long time (step 135). Subsequently, it is removed from the tool, to obtain a product (integration subprocess 130). The product 136 is an integrated molded object PC, but as required, it is further mended in a mending step 141 to obtain a product 142 (post-processing subprocess 140). This product 142 is the final integrated product PC. As described here, the production of the conventional layered product PA needs enormous labor, time and cost compared with the production of the layered product A of the invention. The bonding strength between the layered product PA and the structural member PB of the integrated molded object PC is lower than that of the integrated molded object obtained according to the invention.

Embodiment of the Base Material for Thermal Bonding of the Invention

The base material for thermal bonding of the invention refers to a base material for thermally bonding identical or different adhering members to each other. That is, the base material for thermal bonding is used to bond two or more adhering members to each other, and any heating means is used to form an adhesive layer composed of the base material for thermal bonding at the interface between the adhering members.

The bonding strength S of the base material for thermal bonding, based on the Testing Method of Strength Properties of Adhesives in Shear by Tension Loading according to ISO4587 (JIS K 6850) particularly applied for testing the strength of an adhesive to stiff adhering members, is 5.0 MPa at a testing temperature of 100° C. A preferred adhesive strength S is 7 MPa or higher, and a further more preferred adhesive strength S is 8 MPa or higher.

The testing temperature refers to the ambient temperature when the bonding strength of the member thermally bonded using the base material for thermal bonding is measured, as in the case of the normal bonding strength. A test piece is disposed in a thermostatic chamber, and after it is confirmed that the temperature becomes equivalent to the ambient temperature, the test piece is held by a chuck to carry is out a tensile test.

If the bonding strength S at a testing temperature of 100° C. is less than 5.0 MPa, a problem that the adhering members are easily peeled from each other due to a stress may occur as the case may be, when the bonded product is loaded in a practically high temperature environment.

Furthermore, the bonding strength S of the base material for thermal bonding is 1.0 MPa or lower at a testing temperature of 200° C. Preferred is 0.8 MPa or lower, and further more preferred is 0.7 MPa or lower.

If the bonding strength S at a testing temperature of 200° C. is higher than 1.0 MPa, it may occur that the labor and cost for separating and disassembling the adhering members become large, or that sorting for recycling becomes difficult, or that the accuracy in sorting materials declines to cause contamination due to a different material mixed.

The method for preparing the test pieces used for measuring the bonding strength S is explained below. The bonded test pieces are formed and sized as shown in FIG. 8, based on ISO4587. The test pieces should conform to the Testing Method of Strength Properties of Adhesives in Shear by Tension Loading according to JIS K 6850 particularly applied for testing the strength of an adhesive to stiff adhering members. They are taken from a prepreg obtained by impregnating unidirectional carbon fiber bundles used as the reinforcing fibers with a thermosetting resin. The taken test pieces are laminated in 0°/90°/90°/0° directions to prepare two second test pieces. The base material for thermal bonding is disposed on one of the second test pieces in the region of its surface to be thermally bonded. On the laminate, the other second test piece is overlaid to prepare a preform with the form specified in ISO4587. The preform is placed in a mold for press molding, and as required, a tool and a spacer are used to keep the form, for carrying out press molding. As the press, a hot press molding machine is used at a pressure of 1 MPa for about 5 minutes for preheating and pressing, and in succession a pressure of 1 MPa is applied at the setting temperature of the resin impregnated in the prepreg for 30 minutes, to complete the setting reaction. The preheating temperature is the temperature at which the thermoplastic resin used as the main component of the base material for thermal bonding is molten. Particularly it is desirable that the preheating temperature is selected in a range from the melting point or softening point of the thermoplastic resin to 30° C. higher than the melting point or softening point. The melting point and the softening point are measured by the above-mentioned measuring methods.

The prepreg to be used is not especially limited, but a prepreg with to an epoxy resin (thermosetting resin) impregnated in carbon fiber bundles, with a carbon fiber content (Wf) of 70 wt % and a thickness of 0.11 mm (Torayca UD Prepreg 3053S-12 produced by Toray Industries, Inc.) can be preferably used. When it is used, the adequate setting temperature is from 130 to 150° C. The obtained test pieces are used for evaluating the bonding strength S.

It is preferred that the bonding strength S of the base material for thermal bonding of the invention has specific temperature dependency for the purpose of facilitating the disassembling of the identical or different adhering members by heating. That is, it is preferred that if $S_t$ is the bonding strength at given testing temperature t (° C.) and $S_{(t+30)}$ is the bonding strength at testing temperature (t+30) (° C.), then the testing temperature t satisfying the relation of $S_t \geq 3 \times S_{(t+30)}$ is in a temperature range from 100 to 200° C. It is more preferred that the temperature range is from 120 to 180° C., and a further more preferred ranged is from 130 to 170° C.

The base material for thermal bonding of the invention is obtained by processing a thermoplastic resin composition into the form of the base material. The thermoplastic resin composition used is not especially limited, but for the purposes of obtaining the temperature dependency and the high bonding strength at room temperature, it is preferred that the thermoplastic resin composition is a resin containing at least one resin selected from polyamide resins, polyester resins and polycarbonate resins as a component. Especially a polyamide resin is preferred. A polyamide resin is a polymer containing an amino acid, lactam or diamine and a dicarboxylic acid as main components, and as a component of the base material for thermal bonding, its homopolymer or copolymer can also be used. In view of the temperature dependency of the bonding strength S, a copolyamide resin is more preferred.

Particular examples of useful polyamide resins include polyamide 11, polyamide 12, polyamide 610, polyamide 612, polyamide 66/6, polyamide 6/66/610, polyamide 6/66/612, polyamide 6/66/610/612, and polyamide 6/61. Two or more of them can also be used together. Above all, a base material for thermal bonding containing ternary copolyamide 6/66/610 as a component is a desirable mode.

It is preferred that the thermoplastic resin composition contains a flame-retardant ingredient for the purpose of application as a member required to be flame retardant. As the flame-retardant ingredient, any of publicly known flame retarders such as halogen compounds, antimony compounds, phosphorus compounds, nitrogen compounds, silicone compounds, fluorine compounds, phenol compounds and metal hydroxides can be used. In view of environmental load, phosphorus compounds such as ammonium polyphosphate, polyphosphazenes, phosphates, phosphonates, phosphinates, phosphine oxide and red phosphorus can be preferably used. The thermoplastic resin composition can contain a filler, additives, another thermoplastic resin, etc. to such an extent that the object of the invention is not impaired.

Usable additives include a crystal nucleating agent, ultraviolet light absorber, antioxidant, damping material, antimicrobial agent, insecticide, deodorant, coloration preventive, thermal stabilizer, releasing agent, antistatic agent, plasticizer, lubricant, coloring agent, pigment, dye, foam inhibitor, coupling agent, etc.

The style of the base material for thermal bonding of the invention is not especially limited, and for example, can be a nonwoven fabric, film or sheet. In view of handling convenience, a nonwoven fabric or film is preferred.

In the case where the base material for thermal bonding is used for bonding complicatedly shaped adhering members, it is required that the base material for thermal bonding can be flexibly formed. In this case, it is preferred that the base material for thermal bonding is provided as a nonwoven fabric. The nonwoven fabric can also be a one produced by a publicly known production method, considering the style of use.

From the viewpoint of disposing the base material for thermal bonding to the adhering members more uniformly, it is preferred that the base material for thermal bonding is provided as a film. The properties of the film are not especially limited, and a film produced by a publicly known method can be used. It is preferred in view of flexibility in adaptation for complicated shapes that the thickness of the film is from 0.01 to 0.5 mm. A more preferred range is from 0.03 to 0.2 mm.

It is preferred in view of handling convenience that the unit weight of the base material for thermal bonding of the invention is from 1 to 100 g/m$^2$. A more preferred range is from 3 to 80 g/m$^2$ and a further more preferred range is from 5 to 60 g/m$^2$.

The base material for thermal bonding of the invention can be used for bonding adhering members selected from a wide range of materials such as thermosetting resins, thermoplastic resins, metallic materials, carbon-based materials, fibers, wood and paper. One of preferred styles of the adhering members is a layered product composed of a thermosetting resin composition, in which groups of reinforcing fibers consisting of numerous continuous filaments are arranged in layers. Examples of the thermosetting resin include epoxy resins, maleimide resin, phenol resins, vinyl ester resins, unsaturated polyester resins, resins having cyanic ester ends, resins having allyl ends, resins having acetylene ends, resins having nadic acid ends, and resins having benzocyclobutene at the ends. In view of the mechanical properties of the adhering member, an epoxy resin can be preferably used.

Examples of the reinforcing fibers used include carbon fibers, metal fibers, glass fibers, organic fibers, inorganic fibers, and fibers obtained by covering these fibers with a conductive material. Among them, in view of the excellent balance between the light weight and the mechanical properties of the adhering member, carbon fibers can be preferably used.

Figure 13:
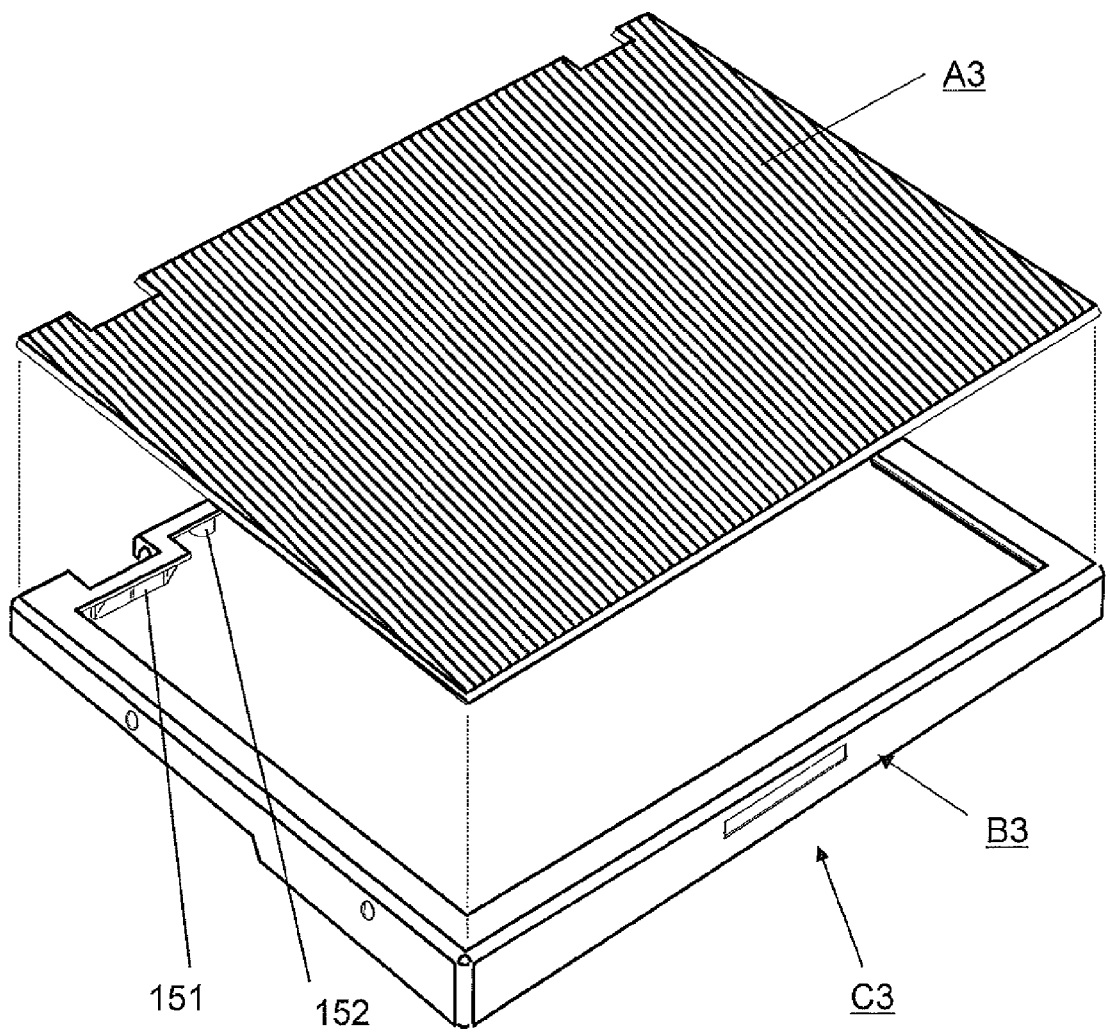
FIG. 13 is an exploded perspective view showing a model of a housing of an electric or electronic apparatus as another example of the integrated molded object of the invention.

The base material for thermal bonding of the invention can be preferably used as the base material 62 for thermal bonding in the process for producing the layered product of the invention. Electromagnetic-shielding Molded Object of the Invention:

In reference to FIG. 13, the electromagnetic-shielding molded object C3 of the invention is explained. In FIG. 13, the electromagnetic-shielding molded object C3 is obtained by integrating a first structural member A3 composed of a resin composition in which groups of continuous conductive fibers consisting of numerous filaments are arranged in layers, and a second structural member B2 consisting of a thermoplastic resin composition.

Examples of the conductive fibers used in the first structural member A3 include fibers that per se are conductive, for example, metal fibers such as aluminum fibers, brass fibers and stainless steel fibers, polyacrylonitrile-based carbon fibers, rayon-based carbon fibers, lignin-based carbon fibers, pitch-based carbon fibers and graphite fibers, and furthermore, fibers obtained by covering these fibers further with a conductive material. Furthermore, there are insulating fibers such as glass fibers, organic fibers such as aramid fibers, PBO fibers, polyphenylene sulfide fibers, polyester fibers, acryl fibers, polyamide fibers and polyethylene fibers, and inorganic fibers such as silicon carbide fibers and silicon nitride fibers, respectively covered with a conductive material. Examples of the method for covering fibers with a conductive material include plating method (electrolytic or electroless), CVD method, PVD method, ion plating method and vapor deposition method for metals such as nickel, ytterbium, gold, silver, copper and aluminum. Any one of these methods is used to format least one conductive layer. Any one kind of these conductive fibers can be used or at least two kinds of them can also be used together. In view of the balance among specific strength, specific stiffness and light weight, carbon fibers can be preferably used. Especially polyacrylonitrile-based carbon fibers can be preferably used in view of low production cost.

As the resin component used in the first structural member A3, either a thermosetting resin or a thermoplastic resin can be used. If a thermosetting resin is used, the molded object C3 is excellent in stiffness and strength, and if a thermoplastic resin is used, the molded object C3 is excellent in impact strength and recycling property.

Examples of the thermosetting resin include unsaturated polyesters, vinyl esters, epoxies, phenols (resol type), urea-melamine and polyimides, their copolymers and modification products, and resins obtained by blending at least two of the foregoing. For enhancing impact properties, an elastomer or a rubber component can also be added.

Examples of the thermoplastic resin include polyesters such as polyethylene terephthalate (PET), polybutylene terephthalate (PBT), polytrimethylene terephthalate (PTT), polyethylene naphthalate (PEN) and liquid crystal polyesters, polyolefins such as polyethylene (PE), polypropylene (PP) and polybutylene, styrene-based resins, polyoxymethylene (POM), polyamides (PA), polycarbonates (PC), polymethylene methacrylate (PMMA), polyvinyl chloride (PVC), polyphenylene sulfide (PPS), polyphenylene ether (PPE), modified PPE, polyimides (PI), polyamideimides (PAI), polyetherimides (PEI), polysulfones (PSU), modified PSU, polyethersulfones, polyketones (PK), polyetherketones (PEK), polyetheretherketones (PEEK), polyetherketoneketones (PENN), polyallylates (PAR), polyethernitriles (PEN), phenol resins, phenoxy resins, fluorine-based resins such as polytetrafluoroethylene, furthermore, thermoplastic elastomers based on polystyrene, polyolefin, polyurethane, polyester, polyamide, polybutadiene, polyisoprene and fluorine, etc., their copolymers and modification products, and resins obtained by blending at least two of the foregoing. An elastomer or rubber component can also be added to the thermoplastic resin, for enhancing the impact properties.

It is preferred in view of moldability, mechanical properties and electromagnetic-shielding performance that the conductive fiber content in the resin composition used as a component of the first structural member A3 is from 20 to 90 vol %. A more preferred range is from 30 to 80 vol %.

The style of the first structural member A3 can be, for example, a layered product in which conductive fibers are laminated in layers, a sandwich style in which a core material consisting of a resin composition, a resin reinforced by discontinuous fibers, metal, foam or the like is placed between surface layer materials respectively obtained by arranging conductive fibers in layers, or a sandwich style in which a core material obtained by arranging conductive fibers in layers is placed between surface layer materials. It is preferred that the layered product of the invention is used as the first structural member A3, since the electromagnetic-shielding molded object C3 can be easily produced.

For making the electromagnetic-shielding molded object C3 suit the housing form of an electric or electronic apparatus, it is desired that the first structural member A3 has at least one almost flat portion. It is desirable that more than 50% of the face having the largest area in the first structural member A3 is almost flat.

Considering the housing of an electric or electronic apparatus, in view of small thickness and light weight, it is preferred that the average thickness of the structural member A3 is 1.6 mm or less. More preferred is 1.2 mm or less, and further more preferred is 1.0 mm or less. Especially preferred is 0.8 mm or less. The average thickness of the first structural member A3 is a mean value of the thicknesses measured at least at five points dispersed on the average in the almost flat portion. When the average thickness is measured, the intentionally shaped regions such as ribs, hinges and depressions/projections are excluded.

The projected area of the first structural member A3 is not especially limited, if the structural member can fit the electromagnetic-shielding molded object C3. However, in view of higher electromagnetic-shielding performance as an integrated object, it is preferred that the projected area of the first structural member suits the desired size of the top face of the electronic apparatus housing. Considering the use as the housing of a notebook (laptop) personal computer, it is preferred that the projected area of the first structural member A3 is 200 cm$^2$ or more. More preferred is 400 cm$^2$ or more, and further more preferred is 600 cm$^2$ or more. The projected area is a measure expressing the size of the face of the molded object C3 obtained from the external dimensions of the molded object C3.

The electromagnetic-shielding molded object C3 of the invention has excellent electromagnetic shielding performance. So, the electromagnetic shielding performance value of the first structural member A3 at a frequency of 1 GHz measured by the KEC method is 40 dB or more. It is preferred that the electromagnetic shielding performance value is 45 dB or more, and more preferred is 50 dB or more.

The KEC method is a measuring method specified by Kansai Electronic Industry Development Center, and a test piece is held in a shielding box divided vertically or laterally symmetrically, and the attenuation of the electromagnetic waves is measured using a spectrum analyzer. For this test, a flat plate with an adequate area is cutout partially from the first structural member A3 for use as a test piece.

Considering that the electromagnetic-shielding molded object C3 is used as a housing of an electric or electronic apparatus, from the viewpoint of protecting the member mounted on the molded object C3 from the breaking, deflection and deformation of the molded object C3, it is preferred that the elastic modulus in flexure of at least one almost flat portion of the first structural member A3 based on ASTM D790 is 8 GPa or more. More preferred is 10 GPa or more, and further more preferred is 12 GPa or more. In general, a housing of an electric or electronic apparatus is intended to protect the electronic circuits sensitive to impact, load and electric short-circuit, breakable members and the like respectively contained inside, and it can be considered that the housing is exposed to severe loads. In such an application, not only breaking but also even deflection or deformation due to a load may fatally damage the inside electronic circuits and members.

The elastic modulus in flexure of the first structural member A3 may have different values depending on the directions in which the conductive fibers (reinforcing fibers) are arranged, and the elastic modulus in flexure in this specification means the minimum value of those values. Particularly, the test pieces for measuring the elastic modulus in flexure are prepared as at least four, preferably six test pieces cut out from the almost flat portion of the first structural member A3 at different angles of 0 degree, 45 degrees, 90 degrees and 135 degrees in reference to the longitudinal direction of the first structural member A3. These test pieces are used for measuring the values of elastic modulus in flexure based on ASTM D790. It is preferred that the test pieces are cut out from other than the intentionally shaped regions such as a rib, hinge and depression/projection. In the case where a test piece contains any of these intentionally shaped regions, the thickness of the test piece is measured at other than the region. The minimum value among the values of elastic modulus in flexure obtained from these test pieces is employed as the elastic modulus in flexure referred to here.

The thermoplastic resin composition used for the second structural member B3 as a component of the electromagnetic-shielding molded object C3 can be the same as the thermoplastic resin composition used in the first structural member A3. It is preferred that the thermoplastic resin composition used contains discontinuous reinforcing fibers.

The reinforcing fibers used here are not especially limited and can be the same as the reinforcing fibers used in the layered product A of the invention. It is preferred that the reinforcing fibers contained in the second structural member B2 are conductive fibers. As the conductive fibers, in view of the light weight and mechanical properties of the obtained electromagnetic-shielding molded object C3, carbon fibers are preferred. The reinforcing fibers can also consist of at least two kinds of reinforcing fibers.

In the second structural member B2, it is preferred that the reinforcing fibers are uniformly dispersed in the thermoplastic resin composition. As for the ratio of the thermoplastic resin composition and the reinforcing fibers, in view of the balance among moldability, strength and light weight, the amount of the thermoplastic resin composition is preferably from 25 to 95 wt %, more preferably from 35 to 85 wt %, and the amount of the reinforcing fibers is preferably 5 to 75 wt %, more preferably 15 to 65 wt %.

It is well known that if the lengths of discontinuous reinforcing fibers are longer, the effect of enhancing the strength and stiffness is higher, and that especially the effect of enhancing the impact strength is remarkable. In the resin composition containing the discontinuous reinforcing fibers, the lengths of the discontinuous reinforcing fibers contained in the resin composition are not identical but are distributed in a range of different lengths. To express the fiber lengths of the reinforcing fibers in this state, number average fiber length Ln and weight average fiber length Lw are used.

The number average fiber length Ln is a simple mean value of fiber lengths in the number of measured fibers, and sensitively reflects the contribution of fibers with short fiber lengths. The reinforcing effect based on fiber lengths is larger when the fiber lengths are longer. Since the fibers with long fiber lengths and the fibers with short fiber lengths are different in effect, it is not preferred to consider them equally. In the case where the reinforcing effect by fibers with longer fiber lengths is respected, it is desirable to consider the weight average fiber length Lw. When the mechanical properties of the molded object C3 is judged, it is preferred to consider the weight average fiber length Lw of the discontinuous reinforcing fibers contained in the second structural member B2.

In reference to the ratio Lw/Ln of the weight average fiber length Lw to the number average fiber length Ln, the distribution of fiber lengths can be known. If the value of Lw/Ln is larger than 1, it means that more fibers with longer fiber lengths are contained. It is preferred that the discontinuous reinforcing fibers in the second structural member B3 are longer in fiber length, and that more fibers with longer fiber lengths are contained.

As the discontinuous reinforcing fibers of the second structural member B3, it is preferred that the weight average fiber length Lw is 0.4 mm or more and that the ratio Lw/Ln of the weight average fiber length Lw to the number average fiber length Ln is from 1.3 to 2.0. It is more preferred that the weight average fiber length Lw is from 0.4 to 1.0 mm.

The number average fiber length Ln, the weight average fiber length Lw and the ratio Lw/Ln can be obtained by the following methods. That is, a 10 mm long and 10 mm wide piece is cut out partially from the second structural member B3, as a test piece. The prepared test piece is immersed in a solvent capable of dissolving the thermoplastic resin for 24 hours, for dissolving the resin component. The test piece remaining after dissolving the resin component is observed using a microscope at 10 to 100 times magnification. In this observation, the lengths of optional 400 fibers among the reinforcing fibers in the visual field are measured. With the fiber length of a measured fiber as Li, the number average fiber length Ln and the weight average fiber length Lw are calculated from the following equations:

Number average fiber length $Ln=(\Sigma Li)/(N)$ where N is the number of measured fibers (400).

Weight average fiber length $Lw=(\Sigma Li^2)/(\Sigma Li)$

For producing the second structural member B2 containing reinforcing fibers with a weight average fiber length Lw of 0.4 mm or more and with an Lw/Ln ratio of 1.3 to 2.0 by molding, for example, long-fiber pellets disclosed in JP63-37694B are used. Each of the long-fiber pellets has a length substantially equal to the length of the pellet and consists of reinforcing fibers arranged in the longitudinal direction of the pellet and a thermoplastic resin composition. Coated pellets disclosed in JP60-62912U can also be used. Each of the coated pellets is produced by covering a continuous reinforcing fiber bundle with a thermoplastic resin composition and cutting into a predetermined length. The second structural member B2 can be produced by mixing chopped fibers of 1 to 20 mm in length and pellets of a resin composition and injection-molding. This molding method is preferred.

A molded object obtained by molding long-fiber pellets has more excellent mechanical properties than a molded object obtained by molding short-fiber pellets, since long reinforcing fibers exist in the molded object and since more fibers with long fiber lengths exist. It is preferred that the lengths of long-fiber pellets are from 1 to 20 mm, since the reinforcing effect by long fibers and the effect of preventing the fibers from being caught in the screw of the extruder used for molding are obtained. It is more preferred that the lengths of long-fiber pellets are from 3 to 10 mm.

The thermoplastic resin composition used as a component of the second structural member B3 may contain a filler and additives in response to required properties. The filler and additives include an inorganic filler, flame retarder, conductivity imparting agent, crystal nucleating agent, ultraviolet light absorber, antioxidant, damping material, antimicrobial agent, insecticide, deodorant, coloration preventive, thermal stabilizer, releasing agent, antistatic agent, plasticizer, lubricant, coloring agent, pigment, foaming agent, coupling agent, etc.

Examples of the conductivity imparting agent include carbon black, amorphous carbon powder, natural graphite powder, artificial graphite powder, expanded graphite powder, pitch microbeads, carbon fibers grown from vapor phase, and carbon nanotubes. They can be preferably used for the purpose of further enhancing the electromagnetic-shielding effect of the electromagnetic-shielding molded object C3.

The electromagnetic-shielding molded object C3 of the invention is obtained by integrating the first structural member A3 and the second structural member B3. The method for integrating the first structural member A3 and the second structural member B3 is not especially limited. As one method, the first structural member A3 is molded beforehand, and the second structural member B3 is molded and concurrently integrated with the first structural member A3. As another method, the second structural member B3 is molded beforehand, and the first structural member A3 is molded and concurrently integrated with the second structural member B3. As a further other method, the first structural member A3 and the second structural member B3 are molded respectively separately beforehand, and then both the structural members are integrated. The means for integrating both the structural members include bonding, welding, fitting, inserting, etc. As an especially preferred integration method, the first structural member A3 molded beforehand is inserted into a mold, and then, the thermoplastic resin composition to be molded is into the second structural member B3 is injected, to integrate the second structural member B3 with the first structural member A3. As another preferred integration method, the first structural member A3 molded beforehand and the second structural member B3 molded beforehand are integrated by ultrasonic welding. If the first structural member A3 used in this case is the layered body A of the invention, an excellent bonding strength can be obtained.

As a further other integration method, the second structural member B3 injection-molded beforehand and post-treated is inserted into a press mold and a prepreg destined to form the first structural member A3, having a base material of continuous conductive fibers impregnated with a resin composition, is laid up. Then, vacuum bag molding is carried out to integrate the first structural member A3 and the second structural member B3.

As still further other integration method, the first structural member A3 molded by press molding beforehand and post-treated and the second structural member B3 molded by injection molding beforehand and post-treated are bonded to each other using a well-known adhesive for integration.

The method for producing the first structural member A3 is not especially limited. Examples of the method for producing the first structural member A3 include well-known methods using a thermosetting resin composition such as hand lay-up molding method, spray-up molding method, vacuum bag molding method, pressure molding method, autoclave molding method, press molding method and transfer molding method. In view of processability and mechanical properties, vacuum bag molding method, press molding method and transfer molding method can be preferably used.

The method for producing the second structural member B3 is not especially limited. Examples of the method for producing the second structural member B3 include well-known methods such as injection molding method, extrusion molding method and press molding method. Injection molding method can be suitably used, since it is high in productivity and allows easy mass production of the second structural member B3 complicatedly shaped to have a hinge portion 151 and a boss portion 152 shown in FIG. 13.

The electromagnetic-shielding molded object C3 produced by integrating the first structural member A3 and the second structural member B3 must maintain its integrated structure still after integration. So, it is preferred that the joint interface between the first structural member A3 and the second structural member B3 has an adhesive layer at least partially. It is preferred that the adhesive layer covers an area of more than 50% of the area of the joint interface, and it is more preferred that the adhesive layer covers an area of more than 70% of the area of the joint interface. It is especially preferred that the adhesive layer covers the entire surface of the joint interface.

The material of the adhesive layer can be a material composed of a component different from or similar to the material constituting the first structural member A3 or the second structural member B3. It is preferred in view of the bonding strength to the second structural member B3 that the material of the adhesive material is a resin similar to the thermoplastic resin composition used as a component of the second structural member B3.

The form of the electromagnetic-shielding molded object is not especially limited. The electromagnetic-shielding molded object C3 may have a curved surface, rib, hinge, boss or hollow portion. The electromagnetic-shielding molded object C3 can also be treated for being decorated on the surface by plating, coating, vapor deposition, insertion, stamping or laser irradiation, etc. Especially if the pattern expressing the reinforcing fibers in the first structural member A3 can be observed from outside, it can create a design effect in the electromagnetic-shielding molded object C3.

The electromagnetic-shielding molded object C3 can be used for the applications as exemplified for the layered product A of the invention. Suitable applications include housings of electric and electronic apparatuses such as personal computers, displays, office automation apparatuses, cellular phones, portable information terminals, facsimiles, compact discs, portable MDs, portable radio cassettes, PDAs (portable information terminals such as electronic pocketbooks), video cameras, digital still cameras, optical apparatuses, audio apparatuses, air conditioners, lighting apparatuses, amusement articles, toys and other household electric appliances, and internal members such as trays and chassis, their cases, mechanical parts, electric equipment members and internal parts of motor vehicles and is aircraft, etc.

The electromagnetic-shielding molded object C3 can be suitably used as a housing or external member of an electric or electronic apparatus because of its excellent electromagnetic-shielding performance, and can also be suitably used as a housing of a notebook personal computer, portable information terminal or the like requiring a small thickness and a wide projected area. In the case where the electromagnetic-shielding molded object C3 is used as such a housing, in view of electromagnetic-shielding performance, it is preferred that at least a portion of the top face of the housing is formed by the first structural member A3. It is more preferred that more than 50% of the projected area of the top face is formed by the first structural member A3, and it is further more preferred that more than 70% of the projected area of the top face is formed by the first structural member A3. In the case where the electromagnetic-shielding molded object C3 requires a complicated form internally, it is preferred that a frame, boss, rib, hinge, runner and a member containing any of them is formed in the second structural member B3.

EXAMPLES

The invention is described below more particularly based on examples and comparative examples. All the mixing rates (%) shown in the examples and comparative examples are values based on weight percent, unless otherwise stated.

Examples 1

Layered Products and Integrated Molded Objects

Example 1-1

Layered Product A4

Figure 14:
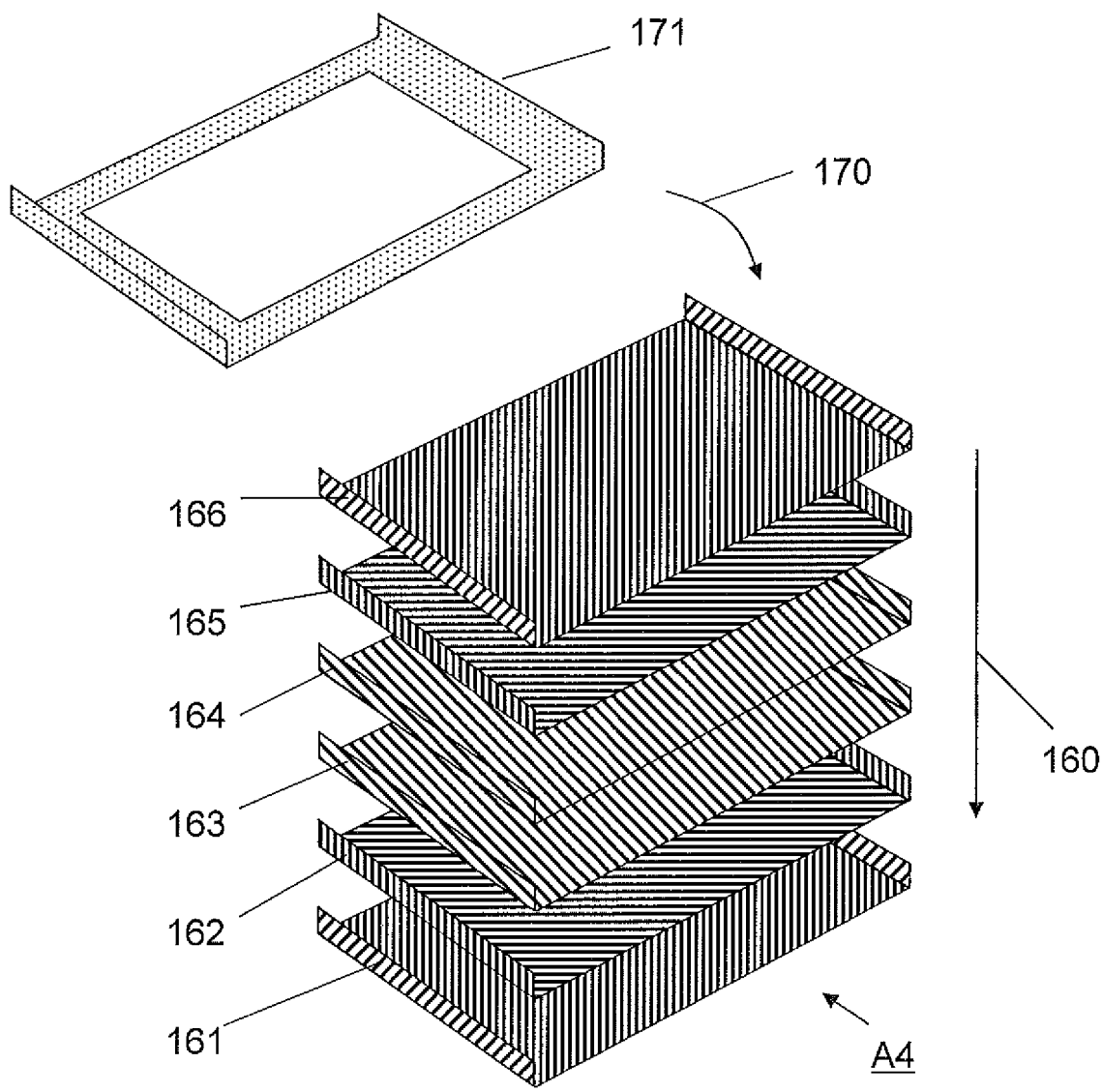
FIG. 14 is an exploded perspective view showing another example of the layered product of the invention.

Six rectangular prepreg sheets with a predetermined size were cut out from a prepreg consisting of an epoxy resin (thermosetting resin) as the matrix resin and groups of reinforcing fibers consisting of numerous carbon filaments arranged in one direction, with the content of the reinforcing fiber groups kept at 70% in terms of weight (Wf) and 61% in terms of volume (Vf) (Torayca Prepreg P6053-12 produced by Toray Industries, Inc.). In FIG. 14, these six sheets 161 to 166 are shown as a perspective view. The respective sheets were bent at both the ends to have short walls.

The six prepreg sheets 161 to 166 were laminated in this order from bottom (indicated by arrow 160) in a female mold member (not shown in the drawing) of a press molding machine with the directions of fibers kept at 45° C., −45°, 90°, 90°, −45° and 45° from above with the long side direction of the rectangle as 0°.

On the other hand, base material tapes for thermal bonding with a predetermined width were prepared from the base material for thermal bonding explained in the Example 3-1 described later. Two base material tapes 171 for thermal bonding were overlaid, and they were laminated on the prepreg sheet 166 to cover the peripheral width portions of about 20 mm and the bent ends (indicated by arrow 170).

Then, a male mold member (not shown in the drawing) was installed for carrying out press molding. A press molding machine was used for preheating at 160° C. for 5 minutes, to melt the base material 171 for thermal bonding, and with a pressure of 6 MPa applied, the laminate was heated at 150° C. for 30 minutes, to set the thermosetting resin. After completion of setting, the laminate was cooled at room temperature and removed from the mold, to produce a layered product A4 with an average thickness of 0.7 mm.

From the portion of the produced layered product A4 where the base material 171 for thermal bonding was laminated, a test piece of 10 mm×10 mm square was cut out, and ultrasonically washed using methyl alcohol for 30 minutes, to remove the thermoplastic resin of the base material 171 for thermal bonding. The obtained test piece was observed with an SEM. On the surface of the test piece, a state where the fiber bundles were exposed was observed. Furthermore, in a cross section of the test piece, a two-layer structure consisting of a layer of fiber groups having void in the surface direction of the layered product A4 and a layer of fiber groups not having any void in the inner direction of the layered product A4 was observed. This two-layer structure is shown in FIG. 5. It can be seen that the interface 44 between the thermosetting resin layer and the thermoplastic resin layer is rugged. The layer of the fiber groups 43b having the void 45 is an area where the continuous filaments in the thermoplastic resin layer are arranged. In this area, the maximum thickness Tpf-max and the minimum thickness Tpf-min of the area where the filaments 43b existed were measured. The minimum thickness Tpf-min was 30 μm, and the maximum thickness Tpf-max was 50 μm.

The portion of the obtained layered product A4 where the base material tapes for thermal bonding were not laminated was cut out, and the glass transition temperature of the resin of the thermosetting resin layer was measured by means of DSC produced by Perkin Elmer. The measured glass transition temperature was 130° C.

In order to measure the values of the elastic modulus in flexure in the directions of 0°, 45°, 90° and 135° with the longitudinal direction of the rectangle as 0°, test pieces were cut out at the respective angles from the rectangular bottom of the obtained layered product A4. The measured elastic modulus in flexure was maximum in the direction of 45°, namely, in the fiber direction of the outermost layer, and the value was 116 GPa. The measured elastic modulus in flexure was minimum in the direction of 135°, namely, in the direction of 90° to the fibers of the outermost layer, and the value was 25 GPa.

From the obtained layered product A4, layered boards with a form in accordance with the adhering members of ISO4587 were cut out. The layered boards were joined in such a manner that the portions having the base material tapes for thermal bonding of the layered product A4 were bonded to each other, and the laminate was pressed with a pressure of 6 MPa kept applied at 180° C. for 5 minutes, to prepare a test piece. The obtained test piece was used to measure the bonding strength at room temperature, and the value was 20 MPa. After completion of the strength test, the test piece was observed at the joint interface, and it was observed that the filaments separated from the laminated product A4 adhered.

Example 1-2

Integrated Molded Object C5

Figure 15:
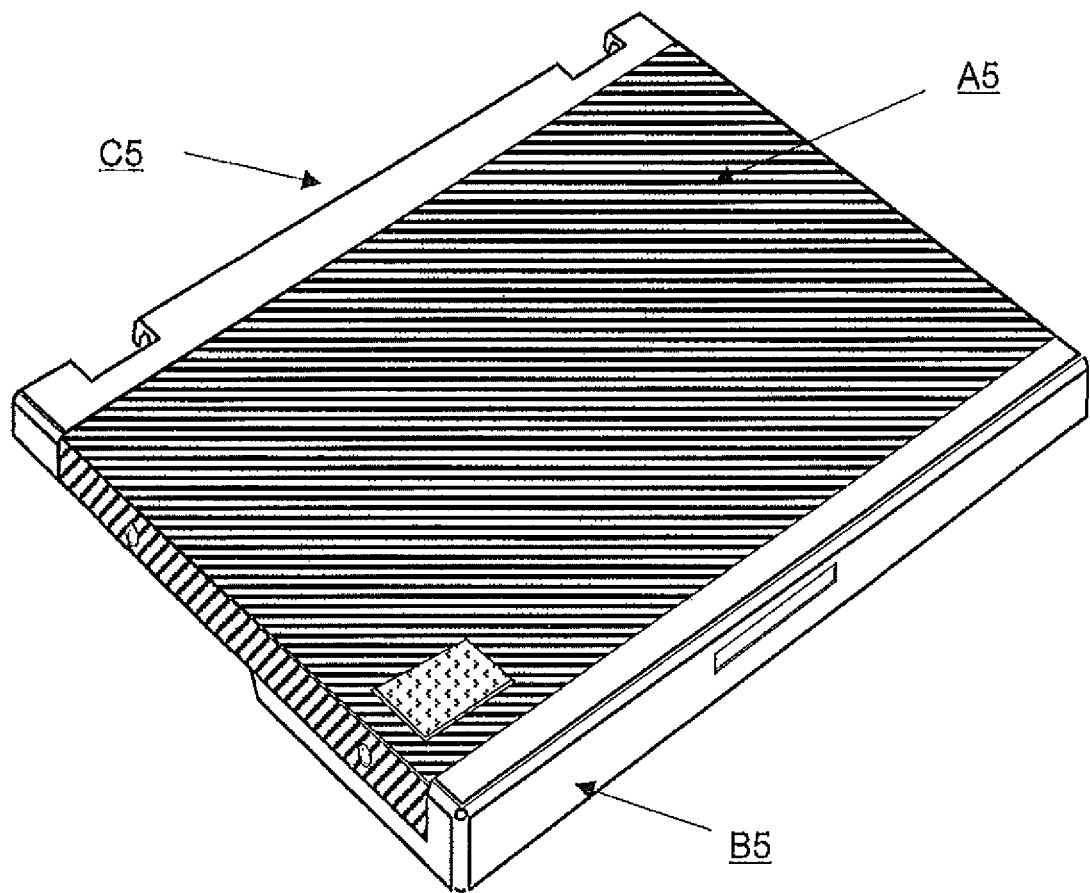
FIG. 15 is a perspective view showing a model of a housing of an electric or electronic apparatus as a further other example of the integrated molded object of the invention.

An integrated molded object C5 shown in FIG. 15 was produced. The layered product (1-1) was used as the layered product A5, and it was inserted into a mold for injection molding (not shown in the drawing). Long-fiber pellets having a polyimide-based resin as the matrix resin and having a carbon fiber content of 20% in terms of weight (Wf) (TLP1146 produced by Toray Industries, Inc.) was pre-arranged. The pellets were injection-molded to form an adhering member B5 having a peripheral frame portion, boss and hinge portion for the inserted layered product A5, for producing an integrated molded object C5. A base material tape for thermal bonding obtained from the base material for thermal bonding explained in the Example 3-1 described later had been stuck to the inserted layered product A5 on the portion destined to be the joint interface with the adhering member B5. For injection molding, J350EIII Injection Molding Machine produced by The Japan Steel Works, Ltd. was used, and the cylinder temperature was 280° C.

Example 1-3

Layered Product A6

At first, pellets of polyamide 12 resin (melting point 180° C., produced by Ube Industries, Ltd.) were hot-pressed, to prepare a base material for thermal bonding as a 70 µm thick film. Then, according to the same procedure as explained for Example 1-1, sheets of the prepreg were laminated, and one film of the base material for thermal bonding produced was laminated on the entire laminate.

Subsequently a hot plate was used for preheating at 190° C. for 5 minutes to melt the base material for thermal bonding, and a press molding machine was used for heating at 150° C. for 30 minutes while applying a pressure of 3 MPa, to produce a layered product A6 with an average thickness of 0.8 mm.

Formic acid was used to remove the thermoplastic resin from the obtained layered product A6, and the thickness of the area where continuous filaments were arranged in the thermoplastic resin layer was measured. The minimum thickness Tpf-min was 20 µm, and the maximum thickness Tpf-max was 30 µm. The glass transition temperature of the resin of the thermosetting resin layer was 139° C.

The elastic modulus in flexure of the layered product A6 was minimum in the direction of 135°, and the value was 26 GPa.

According to the same procedure as described for Example 1-1, a pressure of 6 MPa was applied to press at 195° C. for 5 minutes, to prepare a test piece. The test piece was used to measure the bonding strength at room temperature according to ISO4587, and the value was 14 MPa. After completion of bonding strength test, the test piece was observed at the joint interface, and it was observed that the filaments separated from the layered product A6 adhered.

Example 1-4

Integrated Molded Object C7

According to the same procedure as described for Example 1-2, the layered product A6 was inserted into the mold, to produce an integrated molded object C7.

Example 1-5

Layered Product A7

According to the same procedure as described for Example 1-1 except the following, a layered product A7 was produced. Before laminating the sheets of a prepreg, a polyamide 6 film (Rayfan NO1401, thickness 50 µm, melting point 210° C., produced by Toray Gosei Film K.K. was disposed on the entire lamination face of a female mold member as the base material for thermal bonding. Then, sheets of a woven fabric prepreg having an epoxy resin as the matrix resin with the content of the groups of unidirectionally arranged carbon fibers kept at 60% in terms of weight (Wf) (Torayca Prepreg F6343B-05P produced by Toray Industries, Inc.) were laminated to be 0°/90°. Furthermore, four sheets of a unidirectional prepreg (Torayca Prepreg P6053-12 produced by Toray Industries, Inc.) having an epoxy resin as the matrix resin with the content of the groups of unidirectionally arranged carbon fibers kept at 60% in terms of weight (Wf) were laminated to be 45°, −45°, −45° and 45°, and sheets of the woven fabric prepreg (F6343B-05P) were laminated again to be (0°/90°). Finally a polyamide 6 film (Rayfan NO1401) was laminated again on the entire laminate of prepregs as the base material for thermal bonding.

Then, before press molding, a hot plate was used for preheating at 225° C. for 3 minutes, to melt the base material for thermal bonding, and a press molding machine was used to heat at 150° C. for 30 minutes while applying a pressure of 6 MPa, to produce a layered product A7 with an average thickness of 0.9 mm.

For the obtained laminated product A7, according to the same procedure as described for Example 1-3, the thickness of the area where continuous filaments were arranged in the thermoplastic resin layers was measured. The minimum thickness Tpf-min was 10 µm, and the maximum thickness Tpf-max was 40 µm.

The thermoplastic resin layers on both the surfaces were removed by cutting, and the glass transition temperature of the resin of the thermosetting resin layer was measured. The measured glass transition temperature was 132° C.

In order to measure the elastic modulus in flexure in the directions of 0°, 22.5°, 45°, 90°, 112.5° and 135° with the longitudinal direction of the rectangle as 0°, test pieces were cut out at the respective angles from the rectangular bottom of the obtained layered product A7. The measured elastic modulus in flexure of the layered product A7 was minimum in the direction of 22.5°, and the value was 20 GPa.

According to the same procedure as described for Example 1-1, a pressure of 6 MPa was applied for pressing at 225° C. for 5 minutes, to prepare a test piece. The prepared test piece was used to measure the bonding strength at room temperature according to ISO4587, and the value was 16 MPa. After completion of the bonding test, the test piece was observed at the joint interface, and it was observed that the filaments separated from the layered product A7 adhered.

Example 1-6

Integrated Molded Object C8

According to the same procedure as described for Example 1-2, the layered product A7 was inserted into the mold, to produce an integrated molded object C8.

Furthermore, the long-fiber pellets (TLP1146 produced by Toray Industries, Inc.) were injection-molded to prepare an adhering member B8 similar to the adhering member B5 shown in FIG. 15. The adhering member B8 was bonded to the obtained integrated molded object C8 by ultrasonic welding. For the ultrasonic welding, Ultrasonic Welding Machine SONOPETΣ-1200S/R produced by Seidensha Electronics Co., Ltd. was used at a frequency of 19 kHz and at a pressing pressure of 1 kN.

Example 1-7

Layered Product A9

According to the same procedure as described for Example 1-1, sheets of the prepreg were laminated, and finally one polycarbonate film (Polycarbonate Film, thickness 50 μm, produced by Bayer Ltd.) was laminated on the entire laminated prepreg as the base material for thermal bonding.

Then, a hot plate was used for preheating at 260° C. for 3 minutes, to melt the base material for thermal bonding, and a press molding machine was used for heating at 150° C. for 30 minutes while applying a pressure of 6 MPa, to produce a layered product A9 with an average thickness of 0.7 mm.

Methylene chloride was used to remove the thermoplastic resin from the obtained layered product A9, and the thickness of the area where continuous filaments were arranged in the thermoplastic resin layer was measured. The minimum thickness Tpf-min was 10 μm, and the maximum thickness Tpf-max was 20 μm.

The thermoplastic resin layers on both the surfaces were removed by cutting, and the glass transition temperature of the resin of the thermoplastic resin layer was measured. The measured glass transition temperature was 134° C.

The measured elastic modulus in flexure of the layered product A9 was minimum in the direction of 135°, and the value was 25 GPa.

According to the same procedure as described for Example 1-1, a pressure of 6 MPa was applied for pressing at 260° C. for 3 minutes, to prepare a test piece. The prepared test piece was used to measure the bonding strength at room temperature according to ISO4587, and the value was 11 MPa. After completion of the bonding test, the test piece was observed at the joint interface, and it was observed that the filaments separated from the layered product A9 adhered.

Example 1-8

Integrated Molded Object C10

A polycarbonate resin (Polycarbonate Resin Lexan 121R produced by GE Plastics Japan Ltd.) and chopped carbon fibers (Chopped Carbon Fibers TS-12 produced by Toray Industries, Inc.) were compounded using a two-screw extruder (Two-screw Extruder TEX-30α produced by The Japan Steel Works, Ltd.), to prepare pellets with a fiber content of 30 wt % for injection molding.

The layered product A9 was inserted into a mold for injection molding, and the prepared pellets for injection molding were used to produce an integrated molded object C10.

In each of the integrated molded objects of Examples 1-2, 1-4, 1-6 and 1-8, a layered product with excellent stiffness and a structural member as an injection molded member advantageous for complicated shape molding were bonded strongly to each other, and found to be suitable for housings of electric and electronic apparatuses such as notebook personal computers. Furthermore, the pattern of the reinforcing fibers in the layered product could be observed from is outside, to confirm that the commercial value could be further enhanced.

Comparative Example 1-1

Layered Product PA1

According to the same procedure as described for Example 1-1, except that the base material for thermal bonding was not laminated, sheets of a prepreg were laminated.

Subsequently, a pressure of 6 MPa was applied with heating at 150° C. for 30 minutes, for carrying out press molding, to produce a layered product PA1 with an average thickness of 0.7 mm.

The obtained layered product PA1 was not thermally adhesive to the other member PB1, since no thermoplastic resin layer was formed on the surface of the molded object PC1. Layered boards with a form similar to that of the adhering member of ISO4587 were cut out, and they were bonded to each other with a pressure of 1 MPa applied at 25° C. for 24 hours using a two-pack epoxy adhesive (Swan Bond 4000 produced by Takada Chemical Products Mfg. Co., Ltd.) at the joint, to prepare a test piece. The obtained test piece was used to measure the bonding strength at room temperature. The measured bonding strength was 4 MPa.

Comparative Example 1-2

Integrated Molded Object PC2

According to the same procedure as described for Example 1-2, the layered product PA1 of Comparative Example 1-1 was inserted into a mold for injection molding, and long-fiber pellets (Long-Fiber Pellets TLP1146 produced by Toray Industries, Inc.) were injection-molded to form a peripheral frame portion, boss and a hinge is portion. However, immediately after the product was removed from the mold, the layered product PA1 and the injection-molded member PB1 were separated from each other, not allowing a bonding strength test to be carried out.

Comparative Example 1-3

Layered Product PA3

A layered product PA3 with an average thickness of 0.9 mm was produced as described for Example 1-5, except that a pressure of 6 MPa was applied without preheating, with heating at 150° C. for 30 minutes for carrying out press molding.

The obtained layered product PA3 was washed with formic acid according to the same procedure as described for Example 1-3, but no fiber group layer with void could be observed. A cross section was observed with an SEM, and it was found that continuous filaments were not arranged in the thermoplastic resin layer. It was confirmed that this state was like the state shown in FIG. 6.

The thermoplastic resin layers on both the surfaces were removed by cutting, and the glass transition temperature of the resin of the thermosetting resin layer was measured. The measured glass transition temperature was 130° C.

According to the same procedure as described for Example 1-1, a pressure of 6 MPa was applied for pressing at 225° C. for 5 minutes, to prepare a test piece. The prepared test piece was used to measure the bonding strength at room temperature according to ISO4587. The measured bonding strength was 0.6 MPa, and it was found that the test piece could be separated easily.

Comparative Example 1-4

Integrated Molded Object PC4

According to the same procedure as described for Examples 1-6, the obtained layered product PA4 was inserted into the mold and an integrated molded object PC4 was produced.

The normal bonding strength between the layered product PA4 and the injection-molded member PB4 of the obtained integrated molded object PC4 was measured. The integrated molded object PC4 was soon disassembled at near the interface between the layered product PA4 and the injection-molded member PB4, and the normal bonding strength was found to be lower than 1 MPa. The adhesive face of the injection-molded member PB4 was observed after disassembling, but the adhesion of filaments separated from the layered product PA4 was not observed.

The integrated molded objects of Comparative Examples 1-2 and 1-4 were not sufficient in the bonding strength between the layered product and the injection molded member, and have a problem that they may be separated. So, it was confirmed difficult to produce integrated molded objects using the layered products of the comparative examples by any easy method excellent in productivity or mass productivity unlike the layered products of the examples.

Examples 2

Layered Products and Integrated Molded Objects

Examples are described below in reference to the perspective view of the model housing C2 for an electric or electronic apparatus shown in FIG. 9.

Reference Example 2-1

Material for Injection Molding

A polyamide 6 resin (Polyamide 6 Resin CM1001 produced by Toray Industries, Inc.) and chopped carbon fibers (Chopped Carbon Fibers TS-12 produced by Toray Industries, Inc.) were compounded using a two-screw extruder, TEX-30α produced by The Japan Steel Works, Ltd., to produce pellets for injection molding with a fiber content of 30 wt %.

Example 2-1

Layered Product A21

A prepreg having an epoxy resin (thermoplastic resin) as the matrix resin with a carbon fiber content of 63% in terms of weight (Wf) (Torayca Prepreg 3051S-12 produced by Toray Industries, Inc.) was cut to achieve a predetermined size, and a 350 mm long and 300 mm wide layered product was produced.

Six cut sheets of the prepreg were laminated on a mold for press molding with the directions of fibers kept at 45°, −45°, 90°, 90°, −45° and 45° from above with the longitudinal direction of the rectangular prepreg as 0°. Finally two sheets of the base material for thermal bonding as described later in Example 3-1 described later were laminated on the laminated prepreg.

Then, a press molding machine was used for preheating at 160° C. for 5 minutes to melt the base material for thermal bonding, and then to apply a pressure of 6 MPa while heating at 150° C. for 30 minutes, to set the thermosetting resin. After completion of setting, the laminate was cooled at room temperature, to produce a 0.7 mm thick layered product. When a cross section of the produced layered product was observed with an SEM, the thermoplastic resin was molten to adhere as a film on the surface, and the thickness of the film was 10 μm. The produced layered product was punched for being processed into the form of the layered product A2 (top board) shown in FIG. 9, for use as a layered product A21.

Example 2-2

Integrated Molded Object C22

The layered product A21 produced in Example 2-1 was used as a layered product A22 and inserted into a mold for injection molding, and the pellets for injection molding prepared in Reference Example 2-1 were injection-molded to produce a structural member B22 like the structural member B2 shown in FIG. 9. In the obtained integrated molded object C22, the layered product A22 and the structural member B22 were integrally and strongly bonded to each other. The integrated molded object C22 can be used as a housing.

From the portion of the produced integrated molded object C22 where the layered product A22 and the structural member B22 were bonded to each other, a test piece of 10 mm×1.0 mm was cut out and directly tested to measure the normal bonding strength. An arresting piece and the test piece were bonded to each other using an adhesive (Three Bond 1782), and a normal bonding strength test was carried out. As a result of the test, in an atmosphere of 40° C., no rupture occurred between the layered product and the injection-molded member, but separation occurred at the adhesive portion used to fix an arresting piece and the layered product. In an atmosphere of 140° C., the normal bonding strength was 4 MPa.

Example 2-3

Layered Product A23

According to the same procedure as described for Example 2-1, a prepreg having a plain-woven carbon fiber fabric (Torayca Woven Fabric CO6343 produced by Toray Industries, Inc.) impregnated with an epoxy resin and having a carbon fiber content of 57 vol % was used to produce a layered product A23. As for the lamination structure, four sheets of the prepreg were laminated to be 0°/90° in fiber direction with the longitudinal direction of the rectangle as 0°, and finally a non-woven polyamide-based fabric (Non-woven Polyamide-based Fabric Dynac LNS-0050, unit weight 50 g/m², melting point 135° C., produced by Kureha Chemical Industry Co., Ltd.) was laminated as the base material for thermal bonding on the laminated prepreg.

Then, vacuum bag molding was carried out for heating and setting at 140° C. for 1 hour, to produce a 0.9 mm thick layered product A23. On the surface of the produced layered product A23, the nonwoven fabric was molten to adhere as a film, and the thickness of the film was 25 μm. The obtained layered product A22 was punched for being processed into the form of the layered product A2 shown in FIG. 9, for use as a layered product A23 (top board).

Example 2-4

Integrated Molded Object C24

According to the same procedure as described for Example 2-2, the layered product A23 was used as a layered product A24 and inserted into the mold, and a structural member B24 was produced by injection molding. The normal bonding strength between the layered product A24 and the structural member B24 in the obtained integrated molded object C24 was measured by a method of forcibly holding using a chuck. As a result, in an atmosphere of 40° C., the normal bonding strength was 21 MPa, and furthermore in an atmosphere of 140° C., the normal bonding strength was 2 MPa.

Example 2-5

Layered Product A25

According to the same procedure as described for Example 2-3, a prepreg having a plain-woven carbon fiber fabric (Torayca Woven Fabric CO6343 produced by Toray Industries, Inc.) impregnated with a 180° C. setting epoxy resin and having a carbon fiber content of 57 vol % was used to produce a layered product A25. A polyamide film (Polyamide Film Type 1401, thickness 80 μm, melting point 215° C., produced by Toray Gosei Film K. K. was laminated as the base material for thermal bonding.

Then, vacuum bag molding was carried out for preheating at 220° C. for 5 minutes, to melt the base material for thermal bonding, and for setting the thermoplastic resin at 180° C. for 45 minutes, to produce a 0.9 mm thick layered product A25. On the surface of the produced layered product A25, the nonwoven fabric was molten to adhere as a film, and the thickness of the film was 65 μm. The obtained layered product A25 was punched for being processed into the form of the layered product A2 shown in FIG. 9, for use as a layered product A25 (top board).

Example 2-6

Integrated Molded Object C26

According to the same procedure as described for Example 2-2, the layered product A25 was used as a layered product A26 and inserted into the mold, and a structural member B26 was produced by injection molding. The normal bonding strength between the layered product A26 and the structural member B26 in the obtained integrated molded object C26 was measured according to the same method as in Example 2-4. As a result, in an atmosphere of 40° C., the normal bonding strength was 15 MPa, and furthermore, in an atmosphere of 140° C., the normal bonding strength was 8 MPa.

Comparative Example 2-1

Layered Product PA21

According to the same procedure as described for Example 2-1, except that the base material for thermal bonding was not laminated, a layered product PA21 was produced.

Comparative Example 2-2

Integrated Molded Object PC22

According to the same procedure as described for Example 2-2, the layered product PA21 of Comparative Example 2-1 was used as a layered product PA22 and inserted into the mold, and a structural member PB22 was produced by injection molding. The normal bonding strength between the layered product PA22 and the structural member PB22 in the obtained integrated molded object PC22 was measured by the same method as described for Example 2-2. As a result, in an atmosphere of 40° C., the normal bonding strength was 0.2 MPa, and furthermore, in an atmosphere of 140° C., the normal bonding strength was 0.1 MPa.

In each of the integrated molded objects of Examples 2-2, 2-4 and 2-6, a layered product having excellent stiffness and an injection-molded member advantageous for molding a complicated shape were strongly bonded to each other, and they were found to be suitable as the housings of electric and electronic apparatuses such as notebook personal computers. Furthermore, in a high temperature is atmosphere, the bonding strength declined greatly to facilitate the disassembling of the layered products. So, in view of recycling property, it was recognized that their commercial value was further higher.

The layered product of Comparative Example 2-1 was not thermally adhesive, and even if an integrated molded object was produced using it, no practically usable product was obtained.

In the integrated molded object of Comparative Example 2-2, the bonding strength between the layered product and the injection-molded member was insufficient, and as a product, it had a problem of causing separation. So, it was confirmed that the layered products of the comparative examples were not suitable for producing integrated molded objects by an easy method, unlike the layered products of the examples.

Examples 3

Base Materials for Thermal Bonding

Example 3-1

Pellets of a ternary copolyamide resin (Ternary Copolyamide Resin CM4000, polyamide 6/66/610, melting point 150° C., produced by Toray Industries, Inc.) were used to produce a 1,000 mm wide base material formed like a non-woven fabric by a melt blow method. The unit weight of the base material for thermal bonding was 30 g/m².

It was used as the base material for thermal bonding, to evaluate the bonding strength S based on ISO4587 at a preheating press temperature of 160° C.

Comparative Example 3-1

A polypropylene resin (Polypropylene Resin, melting point 170° C., produced by Chisso Corp.) was used to produce a base material for thermal bonding formed like a nonwoven fabric. It was used as the base material for thermal bonding to evaluate the bonding strength S according to the same method as described for Example 3-1 at a preheating press temperature of 180° C.

Comparative Example 3-2

A polyamide 6 resin (Polyamide 6 Resin, melting point 215° C., produced by Toray Industries, Inc.) was used to similarly produce a base material for thermal bonding formed like a nonwoven fabric. It was used as the base material for thermal bonding to evaluate the bonding strength S according to the same method as described for Example 3-1 at a preheating press temperature of 220° C.

The evaluation results of the above examples are shown in Table 1.

TABLE 1

| | Base material for thermal bonding | Tensile bond strength (MPa) | | | | Evaluation |
|---|---|---|---|---|---|---|
| | | 100° C. | 130° C. | 160° C. | 200° C. | |
| Example 3-1 | Ternary copolyamide resin | 8.0 | 7.9 | 0.7 | 0.4 | Good |
| Comparative Example 3-1 | Polypropylene resin | 2.7 | 1.8 | 1.0 | 0.5 | Poor |
| Comparative Example 3-2 | Polyamide resin | 5.5 | 4.9 | 4.0 | 3.3 | Rather poor |

Table 1 shows the following. That is, the base material for thermal bonding of Example 3-1 shows excellent bonding strength at temperatures not higher than 130° C., and allows easy separation at temperatures not lower than 160° C., being suitable for recycling. On the other hand, the base material for thermal bonding of Comparative Example 3-1 is insufficient in bonding strength at 100° C., showing a problem in view of practical use. Furthermore, the base material for thermal bonding of Comparative Example 3-2 does not allow easy separation even at 200° C., and cannot be recycled as the case may be.

Example 4

Electromagnetic-Shielding Molded Object C41

Example 4-1

In reference to Example 2-2, one mode of the electromagnetic-shielding molded object C41 of the invention can be explained. The electromagnetic-shielding molded object C41 is obtained by integrating the first structural member A3 and the second structural member B3 composed of a thermoplastic resin respectively shown in FIG. 13. Furthermore, the electromagnetic shielding performance of the first structural member A3 by the KEC method is more than 50 dB.

Example 4-2

The layered product obtained in Comparative Example 2-1 was used as a first structural member A3. Then, the mold used in Example 2-2 was used, and instead of inserting the layered product, a spacer was disposed. The pellets for injection molding of Reference Example 2-1 were injection-molded to produce a second structural member B3.

The obtained first structural member A3 and second structural member B3 were washed with alcohol on the faces to be bonded, and Two-Pack Adhesive 3921/3926 produced by Three Bond Co., Ltd. was used to bond them, to produce an integrated molded object C3. After completion of bonding, the integrated molded object was allowed to stand at room temperature for 24 hours.

The electromagnetic shielding performance of the first structural member A3 by the KEC method was more than 50 dB.

Example 4-3

Figure 16:
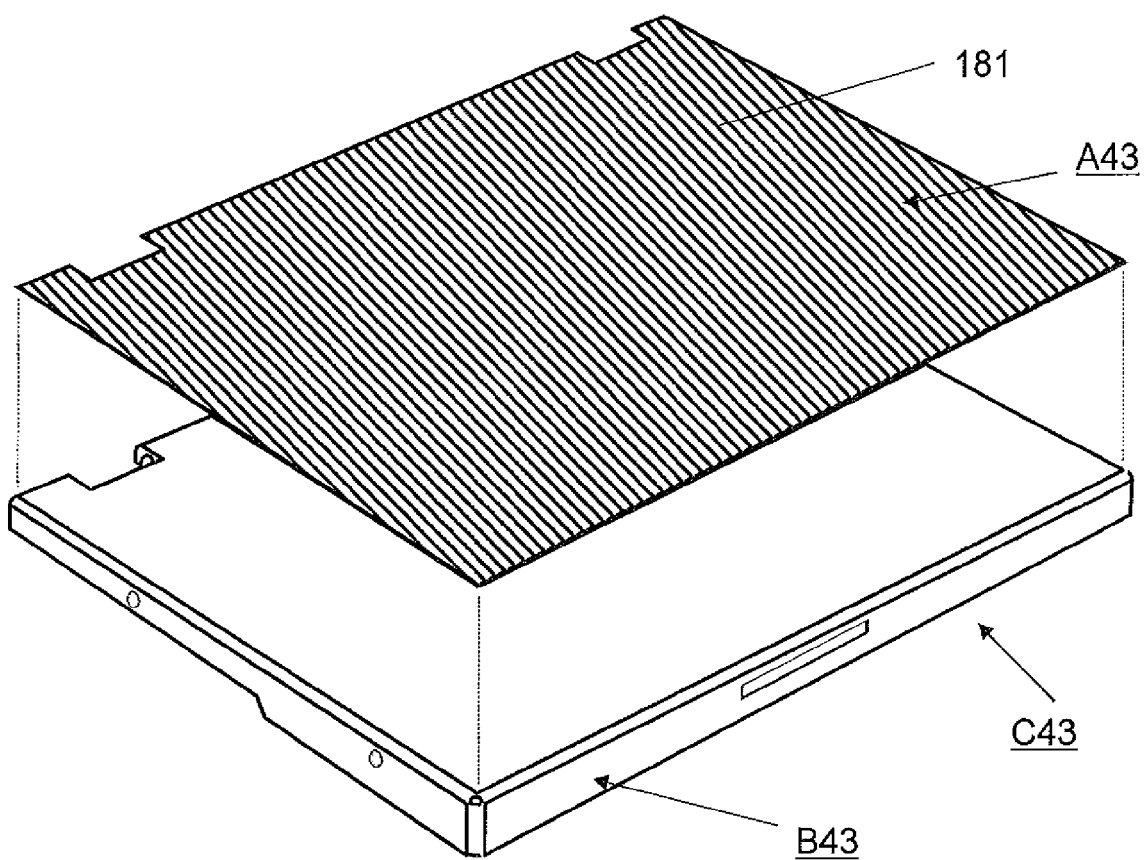
FIG. 16 is an exploded perspective view showing a model of a housing of an electric or electronic apparatus as a still further other example of the integrated molded object of the invention.

FIG. 16 is an exploded perspective view showing an electromagnetic-shielding molded object C43 consisting of a first structural member A43 having a two-layer structure as the top board and a second structural member B43 bonded to it.

A prepreg having Torayca Woven Fabric CO6343 produced by Toray Industries, Inc. impregnated with an epoxy resin and having a carbon fiber content of 57 vol % was singly heated at 150° C. for 30 minutes with a pressure of 6 MPa applied by a press molding machine, to set the thermosetting resin. After completion of setting, it was cooled at room temperature to produce a 0.2 mm thick first structural member A43.

Then, long-fiber pellets (Long Fiber Pellets TLP1146 produced by Toray Industries, Inc.) were injection-molded to produce a second structural member B43.

The obtained first structural member A43 and second structural member B43 were washed with alcohol on the faces to be bonded, and Two-Pack Adhesive 3921/3926 produced by Three Bond Co., Ltd. was used for bonding them to produce an integrated molded object C43. After completion of bonding, it was allowed to stand at room temperature for 24 hours.

The top board 181 of the obtained molded object C43 had a two-layer structure. Its thickness was 1.4 mm, and its electromagnetic shield performance was more than 50 dB. In order to measure the elastic modulus in flexure, test pieces were cut out in respective directions of 0°, 45° and 90° with the longitudinal direction of the top board as 0°. However, the portions containing a boss, rib, hinge or weld were excluded. The elastic modulus in flexure measured using the test pieces was minimum in the direction of 45°, and the value was 15 GPa.

A test piece with a size of 3 mm×3 mm was cut out from the second structural member B43, and immersed in about 100 ml of a solvent (formic acid) for 24 hours, to dissolve the resin component. Then, a paper filter was used to filter the reinforcing fiber component, and the filter residue was observed with a microscope. The fiber lengths (mm) of 400 reinforcing fibers selected at random were measured. The weight average fiber length Lw was 0.48 mm, and the ratio (Lw/Ln) of the weight average fiber length Lw to the number average fiber length Ln was 1.8.

Comparative Example 4-1

The thermoplastic resin prepared in Reference Example 1 was injection-molded to produce a model housing. The thickness of the top board of the produced molded object was 1.2 mm, and the electromagnetic shielding performance was 23 dB. In order to measure the elastic modulus in flexure, test pieces were cut out in the directions of 0°, 30°, 60° and 90° with the longitudinal direction of the top board as 0°. However, the portions including a boss, rib, hinge or weld were excluded. The elastic modulus in flexure measured using the test pieces was minimum in the direction of 45°, and the value was 6 GPa.

The integrated molded objects of Examples 4-1, 4-2 and 4-3 respectively consisted of a structural body having excellent electromagnetic shield performance and stiffness and a structural body produced by injection molding advantageous for molding a complicated shape, and were confirmed to be suitable for housings of electric and electronic apparatuses such as notebook personal computers.

On the other hand, the integrated molded object of Comparative Example 4-1 was insufficient in electromagnetic shielding performance and stiffness, and it was found that when it was mounted on an electric or electronic apparatus, it was found to be too insufficient to meet the severe requirements of recent years such as protection from electromagnetic interference and protection of internal electronic circuits in application as a housing of an electric or electronic apparatus.

INDUSTRIAL APPLICABILITY

The layered product of the invention can be easily integrated with another structural member, and the bonding strength between the bonded members is excellent. The integrated molded object produced using the layered product of the invention is excellent in mechanical properties and light weight, and can be easily disassembled when it is scrapped as waste. Furthermore, the electromagnetic-shielding molded object of the invention has not only excellent electromagnetic shielding performance but also small thickness, light weight and high stiffness, being suitable as a housing of an electric or electronic apparatus such as a personal computer, display or portable information terminal. The base material for thermal bonding of the invention has excellent bonding strength and is suitable as an adhesive material for integrating a layered product with another member.

The invention claimed is:

1. A layered product comprising a prepreg obtained by impregnating unidirectional carbon fiber bundles used as reinforcing fibers with a thermosetting resin; and a base material for thermal bonding which is arranged in a region of a surface of said prepreg to be thermally bonded, and wherein said base material for thermal bonding comprises a polyamide resin selected from the group consisting of polyamide 11, polyamide 12, polyamide 610, polyamide 612, polyamide 66/6, polyamide 6/66/610, polyamide 6/66/612, polyamide 6/66/610/612, and polyamide 6/6I as a thermoplastic resin, wherein the bonding strength (S) of a test piece including the base material for thermal bonding, based on the Testing Method of Strength Properties of Adhesives in Shear by Tension Loading according to ISO 4587 is 5.0 MPa or higher at a temperature of 100 C and 1.0 MPa or lower at a temperature of 200 C.

2. The layered product according to claim 1, wherein, where said bonding strength (S) at a temperature t (° C.) is $S_t$ (MPa) and said bonding strength (S) at a temperature (t+30) (° C.) is $S_{(t+30)}$ (MPa), the relation of $S_t \geq 3 \times S_{(t+30)}$ is satisfied when the temperature t is in the range of from 100° C. to 200° C.

3. The layered product according to claim 1, wherein said base material is composed of a copolyamide-based resin composition.

4. The layered product according to claim 3, wherein said copolyamide contains ternary copolyamide 6/66/610 as a component.

5. The layered product according to claim 1, wherein said base material is in a form of a nonwoven fabric or film having a unit weight of 1 to 100 g/m$^2$.

* * * * *